(12) United States Patent
Lee et al.

(10) Patent No.: US 12,058,906 B2
(45) Date of Patent: Aug. 6, 2024

(54) DISPLAY DEVICE

(71) Applicant: Samsung Display Co., Ltd., Yongin-si (KR)

(72) Inventors: Sanghoon Lee, Yongin-si (KR);
Jonghyun Choi, Yongin-si (KR);
Taewoo Kim, Yongin-si (KR);
Seungmin Lee, Yongin-si (KR);
Seunghwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 470 days.

(21) Appl. No.: 17/420,650

(22) PCT Filed: Jan. 31, 2020

(86) PCT No.: PCT/KR2020/001519
§ 371 (c)(1),
(2) Date: Jul. 2, 2021

(87) PCT Pub. No.: WO2020/226267
PCT Pub. Date: Nov. 12, 2020

(65) Prior Publication Data
US 2022/0102468 A1 Mar. 31, 2022

(30) Foreign Application Priority Data
May 9, 2019 (KR) .................. 10-2019-0054457

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 77/111* (2023.02);
(Continued)

(58) Field of Classification Search
CPC .. H10K 59/131; H10K 50/844; H10K 77/111; H10K 50/8426; H10K 2102/311;
(Continued)

(56) References Cited

U.S. PATENT DOCUMENTS 9,176,535 B2    11/2015 Bohn et al.
9,905,798 B2    2/2018 Jang
(Continued)

FOREIGN PATENT DOCUMENTS

CN    105789255 A    7/2016
CN    107731790 A    2/2018
(Continued)

OTHER PUBLICATIONS

International Search Report of corresponding Application No. PCT/KR2020/001519, dated May 12, 2020, 4 pages.

*Primary Examiner* — Patricia D Valenzuela
(74) *Attorney, Agent, or Firm* — Lewis Roca Rothgerber Christie LLP

(57) ABSTRACT

A display device includes: a bending area between a first area and a second area; a substrate having a first opening, at least a portion of the first opening corresponding to the bending area; a display layer on a first surface of the substrate in the first area; an encapsulation member on the display layer; a first organic material layer on the substrate to cover the first opening of the substrate; and a wiring layer on the first organic material layer and comprising a plurality of wires extending in a direction crossing the bending area.

25 Claims, 25 Drawing Sheets

(51) Int. Cl.
*H10K 77/10* (2023.01)
*H10K 50/842* (2023.01)
*H10K 59/12* (2023.01)
*H10K 59/80* (2023.01)
*H10K 102/00* (2023.01)

(52) U.S. Cl.
CPC ......... *H10K 50/8426* (2023.02); *H10K 59/12* (2023.02); *H10K 59/873* (2023.02); *H10K 2102/311* (2023.02)

(58) Field of Classification Search
CPC ...... H10K 71/00; H10K 50/841; H10K 50/80; H10K 59/124; H10K 50/84; H10K 59/12; H10K 59/873; Y02E 10/549; G09F 9/301
See application file for complete search history.

(56) References Cited

U.S. PATENT DOCUMENTS

| | | |
|---|---|---|
| 10,199,444 B2 | 2/2019 | Kim et al. |
| 10,381,581 B2 | 8/2019 | Jeong et al. |
| 10,719,103 B2 | 7/2020 | Chung et al. |
| 2015/0014644 A1 | 1/2015 | Namkung et al. |
| 2016/0204366 A1 | 7/2016 | Zhang et al. |
| 2017/0352834 A1* | 12/2017 | Kim .................. G02F 1/133305 |
| 2018/0047938 A1 | 2/2018 | Kishimoto et al. |
| 2018/0090698 A1* | 3/2018 | Jeong .................. H10K 59/131 |
| 2018/0090699 A1 | 3/2018 | Shin et al. |
| 2018/0175323 A1 | 6/2018 | Ahn et al. |
| 2018/0175324 A1 | 6/2018 | Fujioka |
| 2019/0094641 A1 | 3/2019 | Choi et al. |
| 2019/0196632 A1 | 6/2019 | Ryu et al. |

FOREIGN PATENT DOCUMENTS

| | | |
|---|---|---|
| CN | 107871762 A | 4/2018 |
| EP | 3346514 A1 | 7/2018 |
| JP | 6175429 B2 | 8/2017 |
| KR | 10-0476533 B1 | 6/2006 |
| KR | 10-2018-0002108 A | 1/2018 |
| KR | 10-2018-0003684 A | 1/2018 |
| KR | 10-2018-0034780 A | 4/2018 |
| KR | 10-2018-0104252 A | 9/2018 |
| KR | 10-2019-0035986 A | 4/2019 |
| KR | 10-2019-0076091 A | 7/2019 |
| KR | 10-2014-0118676 A | 10/2019 |
| KR | 10-2014-0095817 A | 5/2020 |

* cited by examiner

DISPLAY DEVICE

CROSS-REFERENCE TO RELATED APPLICATIONS

This application is a National Phase Patent Application and claims priority to and the benefit of International Application Number PCT/KR2020/001519, filed on Jan. 31, 2020, which claims priority to Korean Patent Application Number 10-2019-0054457, filed on May 9, 2019, the entire contents of all each of which are incorporated herein by reference.

TECHNICAL FIELD

One or more embodiments relate to a display device.

BACKGROUND

Recently, display device has been used for diverse purposes. Also, thicknesses of the display device has been reduced and the display device has small weights, and thus, uses of the display device has been expanded. As the display device is used for numerous purposes, designs of the display device has been diversified, for example, to bend at least a portion of the display device.

DESCRIPTION OF EMBODIMENTS

Technical Problem

One or more embodiments include a display device which may be bent without limitations regardless of a type of a substrate of the display device. However, this objective is an example, and the scope of the disclosure is not limited thereto.

SUMMARY

One or more embodiments include a display device including a bending area between a first area and a second area, the display device further including: a substrate having a first opening, at least a portion of the first opening corresponding to the bending area; a display layer on a first surface of the substrate to be located in the first area; an encapsulation member on the display layer: a first organic material layer on the substrate to cover the first opening of the substrate; and a wiring layer on the first organic material layer and including a plurality of wires extending in a direction crossing the bending area.

The display device may further include at least one inorganic insulating layer on the substrate, and the at least one inorganic insulating layer may have a second opening overlapping the first opening.

The first organic material layer may be exposed through the first opening and the second opening.

The display device may further include a second organic material layer on the wiring layer and overlapping the first organic material layer.

At least one of the first organic material layer or the second organic material layer may include same material as an organic insulating layer included in the display layer.

A portion of the wiring layer located in the first area may be covered by a first insulating layer included in the display layer.

An edge of the first insulating layer may be covered by the second organic material layer.

The first insulating layer may include an inorganic insulating material.

The encapsulation member may include an encapsulation substrate located in the first area and facing the substrate and the display device may further include a sealing member between the substrate and the encapsulation substrate.

The first organic material layer and the second organic material layer may be apart from the sealing member.

The encapsulation member may include at least one organic encapsulation layer and at least one inorganic encapsulation layer.

An edge of the at least one inorganic encapsulation layer may be located on the second organic material layer.

The first organic material layer may include a first surface facing the wiring layer and a second surface that is opposite to the first surface. The first organic material layer may be bent with respect to a bending axis, and a portion of the second surface of the first organic material layer may face a second surface of the substrate, the second surface of the substrate corresponding to the first area.

The first opening may be located only in the bending area, and the substrate may include a first portion and a second portion apart from each other based on the first opening.

The first opening may be located in the bending area and the second area, and the substrate may correspond to only the first area.

One or more embodiments include a display device including a bending area between a first area and a second area, the display device further including: a substrate having a first opening, at least a portion of the first opening corresponding to the bending area; a display layer on a first surface of the substrate to be located in the first area; an encapsulation member on the display layer; a lower organic material layer on the substrate to cover the first opening of the substrate; and a wiring layer on the lower organic material layer and including a plurality of wires extending in a direction crossing the bending area, wherein the lower organic material layer has an area corresponding to the bending area and the second area, the lower organic material layer is bent with respect to a bending axis, and a portion of the lower organic material layer overlaps the substrate corresponding to the first area.

The lower organic material layer may include same material as an organic insulating layer included in the display layer.

The display device may further include at least one upper organic material layer located on the wiring layer and overlapping the lower organic material layer.

A portion of the wiring layer located in the first area may be covered by a first insulating layer included in the display layer, and a distal end of the first insulating layer may be covered by the at least one upper organic material layer.

The first insulating layer may include an inorganic insulating layer.

The encapsulation member may include an encapsulation substrate located in the first area and facing the substrate, the display device may further include a sealing member between the substrate and the encapsulation substrate, and the lower organic material layer and the at least one upper organic material layer are apart from the sealing member.

The encapsulation member may include at least one organic encapsulation layer and at least one inorganic encapsulation layer, and an edge of the at least one inorganic encapsulation layer may be located on the at least one upper organic material layer.

The display device may further include at least one inorganic insulating layer on the substrate, and the at least one inorganic insulating layer may have a second opening overlapping the first opening.

The first opening and the second opening may be located only in the bending area, and the substrate may include a first portion and a second portion apart from each other based on the first opening.

The first opening and the second opening may be located in the bending area and the second area, and the substrate may correspond to only the first area. The above and other aspects, features, and advantages of certain embodiments of the disclosure will be more apparent from the following description taken in conjunction with the accompanying drawings.

Effects of Disclosure

According to the one or more embodiments, the display device may relatively decrease the non-display area by improving the spatial use of the non-display area and may be realized to have the wiring layer that is bent without limitations regardless of the type of the substrate. However, the scope of the disclosure is not limited by these effects.

MODE OF DISCLOSURE

Figure 1:
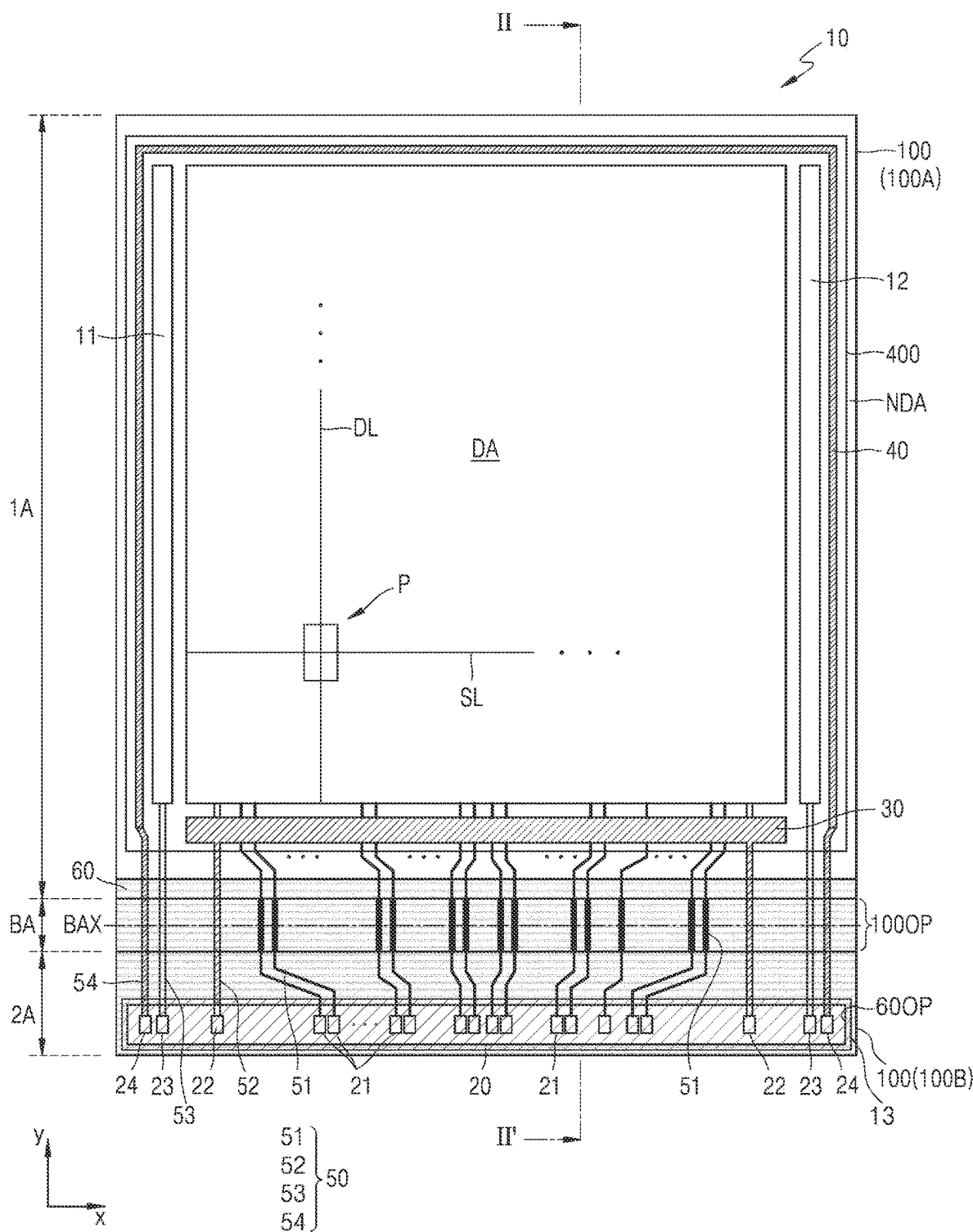
FIG. 1 is a plan view schematically illustrating a display device according to an embodiment.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Throughout the disclosure, the expression "at least one of a, b and c" indicates only a, only b, only c, both a and b, both a and c, both b and c, all of a, b, and c, or variations thereof.

Hereinafter, embodiments of the disclosure will be described in detail with reference to the accompanying drawings. Descriptions will be given by referring to the drawings, whereby same reference numerals will be given to components that are the same or corresponding to one another, and their descriptions will not be repeated.

It will be understood that the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on," another layer, area, or component, it can be directly or indirectly formed on the other layer, area, or component. That is, for example, intervening layers, areas, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it can be directly or indirectly in contact with or electrically connected to the other element, area, or layer.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Display device may display an image and may include a liquid crystal display device, an electrophoretic display device, an organic light-emitting display device, an inorganic light-emitting display device, a field emission display device, a surface-conduction electron-emitter display device, a quantum dot display device, a plasma display device, or a cathode ray display device, etc. Hereinafter, an organic light-emitting display device is described as an example of the display device according to embodiments. However, display device according to the disclosure is not limited thereto and may include various types of display device described above.

FIG. 1 is a plan view schematically illustrating a display device 10 according to some embodiments.

Referring to FIG. 1, the display device 10 may have a bending area BA extending in an x direction (a first direction). The bending area BA may be located between a first area 1A and a second area 2A located in a y direction (a second direction) crossing the x direction.

The display device 10 may be bent with respect to a bending axis BAX extending in the x direction. A bending portion of the display device 10 that is bent with respect to the bending axis BAX may have a constant radius of curvature based on the bending axis BAX. However, the disclosure is not limited thereto. According to some embodiments, the display device 10 may be bent with respect to the bending axis BAX, while a radius of curvature of the bent portion might not be constant.

FIG. 1 may be understood as the shape of the substrate 100. For example, it may be understood that the substrate 100 includes the first area 1A, the second area 2A, and the bending area BA between the first area 1A and the second area 2A.

The substrate 100 may have an opening 100OP corresponding to the bending area BA. In this specification, it may be understood that to face each other denotes to overlap each other. At least a portion of the opening 100OP may overlap the bending area BA, and FIG. 1 illustrates that the opening 100OP generally overlaps the bending area BA.

The opening 100OP may have a certain width in the y direction and a certain length in the x direction on a plane as illustrated in FIG. 1. The length of the opening 100OP may be substantially the same as a length of the substrate 100 in the x direction. Thus, the substrate 100 may include a first portion 100A and a second portion 100B which are apart from each other based on the opening 100OP. The first portion 100A of the substrate 100 may correspond to the first area 1A, the second portion 100B may correspond to the second area 2A, and the opening 100OP may correspond to the bending area BA.

The substrate 100 may include an organic material, such as a polymer, or an inorganic material. According to some embodiments, the substrate 100 may include a glass substrate mainly including a material including the element Si, for example, $SiO_2$.

The first area 1A may include a display area DA. The first area 1A may include the display area DA and a portion of a non-display area NDA outside the display area DA, as illustrated in FIG. 1. The second area 2A and the bending area BA may include the non-display area NDA. The display area DA of the display device 10 may correspond to a portion of the first area 1A and the non-display area NDA may correspond to the other portion of the first area 1A, the second area 2A, and the bending area BA.

The display area DA may be an area in which pixels P are located. The display area DA may provide an image by using light emitted from each of the pixels P. The pixel P may be connected to signal lines, such as a scan line SL extending in the x direction and a data line DL extending in the y direction. According to some embodiments, the pixel P may be connected to power lines transmitting a direct current signal, such as a driving power line, a common power line, etc. The display area DA may be covered by an encapsulation substrate 400 overlapping the substrate 100.

The pixel P may include a pixel circuit electrically connected to the power lines and the signal lines described above, and a display element electrically connected to the pixel circuit, for example, an organic light-emitting diode (OLED). The pixel P may emit, for example, red, green, blue, or white light through the OLED.

The non-display area NDA may include a first scan driver 11, a second scan driver 12, a terminal portion 20, a driving voltage supply line 30, a common voltage supply line 40, and a wiring layer 50.

The first scan driver 11 and the second scan driver 12 may be located in the first area 1A. The first scan driver 11 and the second scan driver 12 may be apart from each other with the display area DA therebetween. The first scan driver and/or the second scan driver 12 may generate and transmit a scan signal to each pixel P through the scan line SL. FIG. 1 illustrates that the two scan drivers are located. However, the disclosure is not limited thereto. According to some embodiments, one scan driver may be located at a side of the display area DA.

The terminal portion 20 may be located at an end portion of the non-display area NDA. For example, the terminal portion 20 may be located in the second area 2A and may include terminals 21, 22, 23, and 24. The terminal portion 20 might not be covered by an insulating layer and may be exposed to be connected to a driver integrated circuit (IC) 13. The driver IC 13 may include a data driver.

The driving voltage supply line 30 may provide a driving voltage to the pixels P. The driving voltage supply line 30 may be located in the non-display area NDA to be adjacent to a side of the display area DA.

The common voltage supply line 40 may provide a common voltage to the pixels P. The common voltage may be a voltage applied to a cathode of the OLED, and the common voltage supply line 40 may be located in the non-display area NDA to partially surround the display area DA.

A first wire 51, a second wire 52, a third wire 53, and a fourth wire 54 may be located between an end portion of the display area DA and the terminal portion 20 and may extend in the y direction. The first wire 51 may electrically connect a signal line of the display area DA to the terminal portion 20 and the second wire 52 may electrically connect the driving voltage supply line 30 to the terminal portion 20. The third wire 53 may electrically connect each of the first scan driver 11 and the second scan driver 12 to the terminal portion 20, and the fourth wire 54 may electrically connect the common voltage supply line 40 to the terminal portion 20.

In FIG. 1, the terminals 21, 22, 23, and 24 of the terminal portion 20 are described by using different reference numerals from the first wire 51, the second wire 52, the third wire 53, and the fourth wire 54. However, the terminals 21, 22, 23, and 24 may be portions of the first wires 51, the second wire 52, the third wire 53, and the fourth wire 54, respectively. For example, an end portion of the first wire 51 may correspond to the terminal 21, an end portion of the second wire 52 may correspond to the terminal 22, an end portion of the third wire 53 may correspond to the terminal 23, and an end portion of the fourth wire 54 may correspond to the terminal 24.

The first through fourth wires 51 through 54 may extend to cross the bending area BA that is bent, for example, in a direction crossing the bending axis BAX, as described below with reference to FIG. 3. FIG. 1 illustrates that the first through fourth wires 51 through 54 are perpendicular to the bending axis BAX. However, the disclosure is not limited thereto. In some embodiments, the first through fourth wires 51 through 54 may obliquely extend to have a certain angle with respect to the bending axis BAX or may extend to have various shapes including the shape of a curved line, the zigzag shape, and the serpentine shape, rather than the shape of a straight line.

The wiring layer 50 including the first through fourth wires 51 through 54 may be located on an organic material layer 60. The organic material layer 60 may be formed to cover at least the bending area BA. For example, the organic material layer 60 may have an area to cover the bending area BA and the second area 2A, while a side of the organic material layer 60 may be located in the first area 1A and the other side of the organic material layer 60 may be located in the second area 2A. The organic material layer 60 may include a plurality of sub-organic material layers and any one of the plurality of sub-organic material layers may have an opening 600P corresponding to the terminal portion 20.

Figure 2:
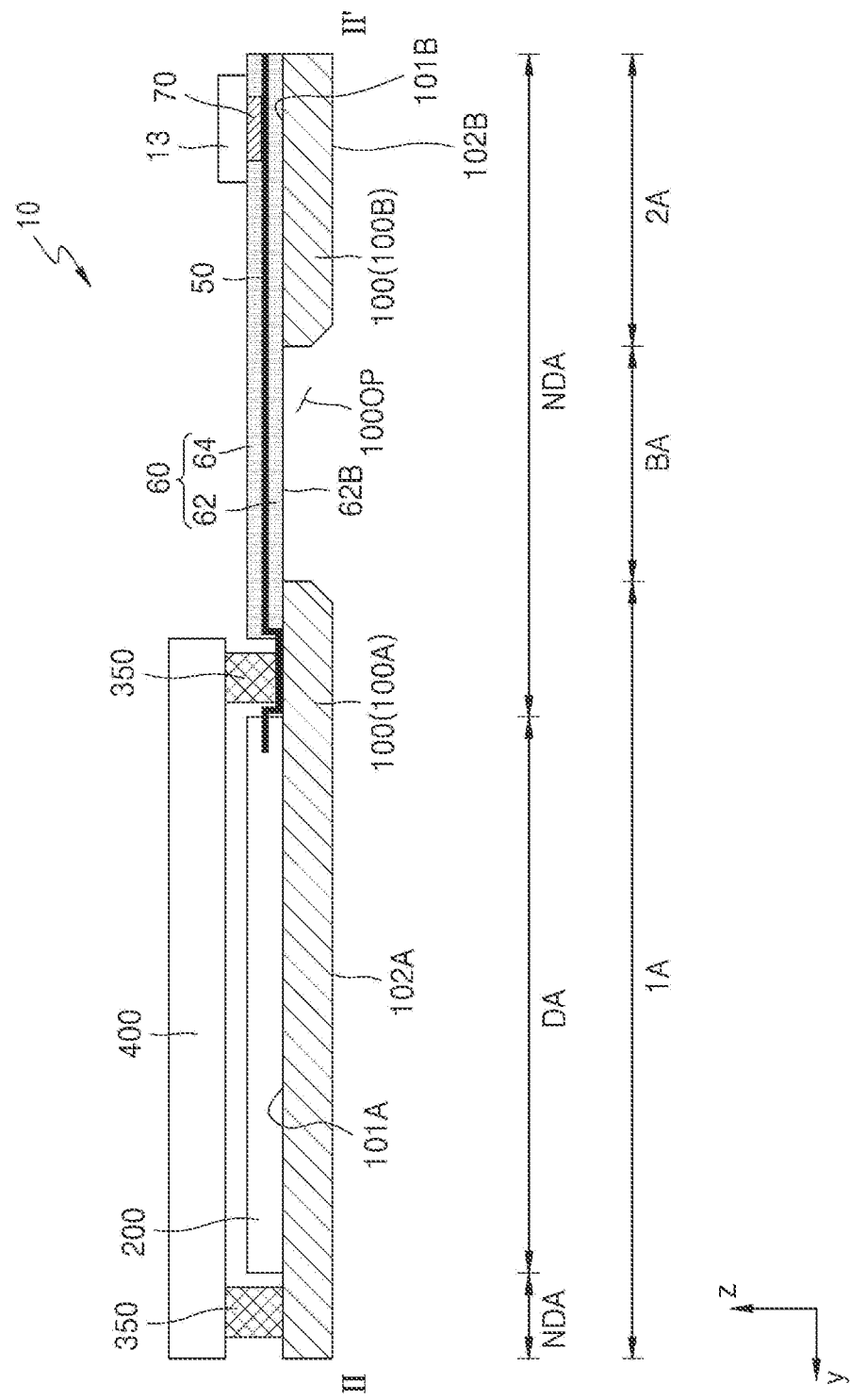
FIG. 2 is a cross-sectional view schematically illustrating a display device according to an embodiment.

FIG. 2 is a cross-sectional view schematically illustrating the display device 10 according to some embodiments. FIG. 2 corresponds to a cross-sectional view taken along the line II-II' of FIG. 1. FIG. 3 is a cross-sectional view illustrating the display device 10 according to some embodiments. FIG. 2 illustrates a cross-section before the display device 10 is bent, for convenience of explanation.

Referring to FIG. 2, the substrate 100 may have the opening 100OP corresponding to the bending area BA. In the cross-section of FIG. 2, the opening 100OP may pass from a top surface of the substrate 100 to a bottom surface of the substrate 100. The substrate 100 may include the opening 100OP and the first portion 100A and the second portion 100B that are located at both sides of the opening 100OP. The first portion 100A of the substrate 100 may correspond to the first area 1A, the second portion 100B may correspond to the second area 2A and the opening 100OP may correspond to the bending area BA.

A display layer 200 may be located on the first portion 100A of the substrate 100. The display layer 200 may include a plurality of pixels. Each pixel may include a display element and a pixel circuit for an operation of the display element. The display layer 200 may include a plurality of display elements and pixel circuits connected to the display elements, respectively.

The display layer 200 may be covered by an encapsulation member. With respect to this aspect. FIG. 2 illustrates an encapsulation substrate 400 as the encapsulation member. The encapsulation substrate 400 may be arranged to face the first portion 100A of the substrate 100. A width of the encapsulation substrate 400 in a y direction may be equal to or less than a width of the first portion 100A of the substrate 100. A sealing member 350 may be located between the encapsulation substrate 400 and the first portion 100A of the substrate 100.

The sealing member 350 may surround the display layer 200. The sealing member 350 may extend along edges of the first portion 100A of the substrate 100 and the encapsulation substrate 400 to surround the display area DA. A space defined by the substrate 100, the encapsulation substrate 400, and the sealing member 350 may be spatially separated from the outside, thereby preventing penetration of external water or impurities. The encapsulation substrate 400 may include a glass substrate. Alternatively, the encapsulation substrate 400 may include a resin substrate. The sealing member 350 may include an inorganic material, such as frit. Alternatively, the sealing member 350 may include a material, such as epoxy.

The wiring layer 50 may extend from an end of the first area 1A to the second area 2A through the bending area BA. The wiring layer 50 may be located on a layer including an organic material, for example, the organic material layer 60. The organic material layer 60 may include a first organic material layer 62 and a second organic material layer 64. The wiring layer 50 may be located above the first organic material layer 62 and below the second organic material layer 64. For example, the wiring layer 50 may contact a first surface of the first organic material layer 62.

The first organic material layer 62 and the second organic material layer 64 may be located only in the non-display area NDA. An end portion of each of the first organic material layer 62 and the second organic material layer 64, the end portion being adjacent to the display area DA, may be apart from the sealing member 350 by a certain distance.

The first organic material layer 62 and the second organic material layer 64 may cover at least the bending area BA. A width of each of the first organic material layer 62 and the second organic material layer 64 in the y direction may be greater than a width of the opening 100OP in the y direction. The first organic material layer 62 and the second organic material layer 64 may be located in a portion of the first area 1A, the portion being adjacent to the bending area BA, the bending area BA, and the second area 2A. The opening 100OP of the substrate 100 may be covered by the organic material layer 60, for example, the first organic material layer 62. Also, a portion of a second surface 62B of the first organic material layer 62, the portion facing a first surface of the substrate 100, may be exposed through the opening 100OP, wherein the first surface of the substrate 100 includes first surfaces 101A and 101B of the first and second portions 100A and 100B of the substrate 100. The first portion 100A and the second portion 100B of the substrate 100 are actually separated from each other via the opening 100OP. The first portion 100A and the second portion 100B of the substrate 100 may be connected to each other via the organic material layer 60.

The first organic material layer 62 and the second organic material layer 64 may include an organic insulating material. The organic insulating material may include a general-purpose polymer, such as polymethylmethacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, and/or a blend thereof. The first organic material layer 62 and the second organic material layer 64 may include the same material as each other or a different material from each other.

The second organic material layer 64 may have an opening portion located in the second area 2A, and a portion of the wiring layer 50, for example, the terminal portion 20 described above with reference to FIG. 1 may be exposed through the opening portion. A conductive material layer 70 may be located in the opening portion of the second organic material layer 64 and the driver IC 13 and the terminal portion 20 may be electrically connected to each other. The conductive material layer 70 may be a portion of the terminal portion 20.

Figure 3:
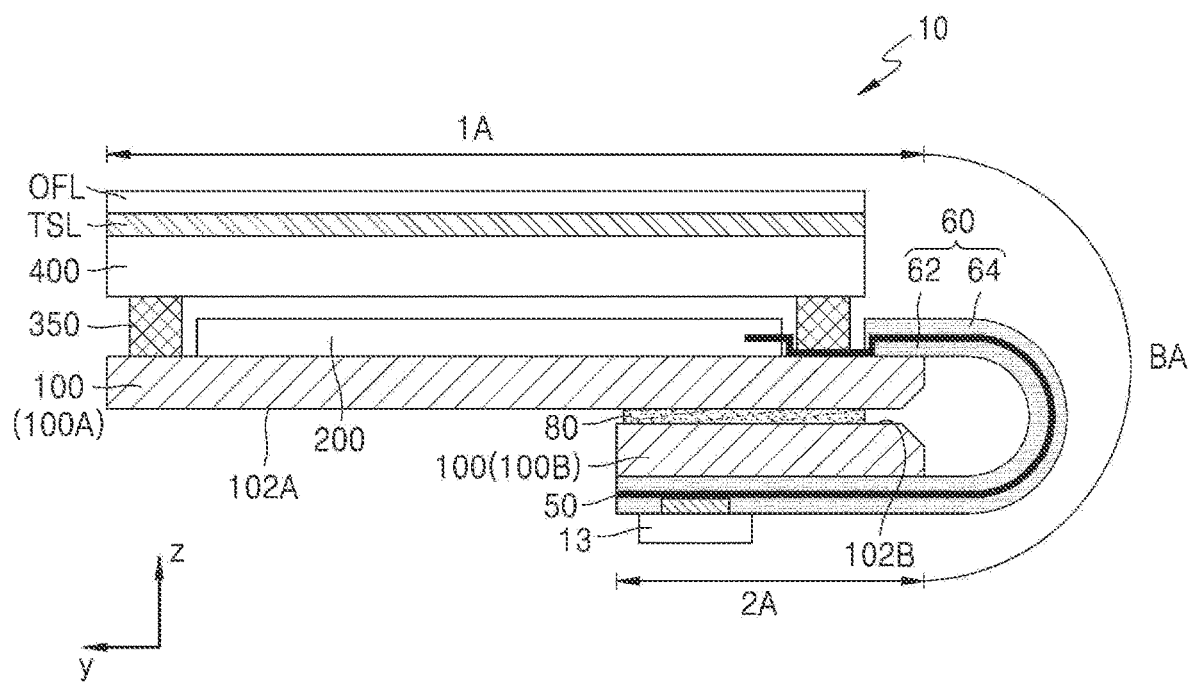
FIG. 3 is a cross-sectional view illustrating a display device according to an embodiment.

Referring to FIG. 3, the organic material layer 60, for example, the first organic material layer 62 and the second organic material layer 64 may be bent with respect to the bending axis BAX adjacent to the opening 100OP of the substrate 100. The wiring layer 50 may be bent together when the first organic material layer 62 and the second organic material layer 64 are bent. Because the substrate 100 includes the opening 100OP, a portion of the non-display area NDA (FIG. 2) of the display device 10 may be bent regardless of a type of a material included in the substrate 100. For example, even when the substrate 100 includes a glass substrate, the organic material layer 60 overlapping the opening 100OP may be bent so that the non-display area NDA (FIG. 2) may be bent.

In the display device 10 that is bent, the second area 2A may overlap the first area 1A. For example, when the organic material layer 60 and the wiring layer 50 are bent, components of the display device 10 that are included in the second area 2A, that is, the second portion 100B of the substrate 100 and the driver IC 13 may overlap components of the display device 10 that are included in the first area 1A, that is, the first portion 100A of the substrate 100 and the display layer 200.

A second surface 102B of the second portion 100B of the substrate 100 may be located to face the second surface 102A of the first portion 100A of the substrate 100. An adhesive layer 80 may be located between the first portion 100A and the second portion 100B of the substrate 100 overlapping each other, for example, between the second surface 102A of the first portion 100A and the second surface 102B of the second portion 100B facing each other.

A touch sensing member TSL and an optical function member OFL may be located on the encapsulation member, for example, the encapsulation substrate 400.

The touch sensing member TSL may obtain coordinate information based on an external input, for example, a touch event. The touch sensing member TSL may include a sensing electrode or a touch electrode and trace lines connected to the sensing electrode or the touch electrode.

The optical function member OFL may reduce a reflectivity of light (external light) incident from the outside toward the display device 10 and/or improve the color purity of light emitted from the display device 10.

According to some embodiments, the optical function member OFL may include a retarder and a polarizer. The phase retarder may be a film-type phase retarder or a liquid crystal coating-type phase retarder and may include a λ/2 phase retarder and/or a λ/4 phase retarder. The polarizer may also be a film-type polarizer or a liquid crystal coating-type polarizer. The film-type polarizer may include an elongation-type synthetic resin film and the liquid crystal coating-type polarizer may include liquid crystals located in a certain shape of arrangement.

According to some embodiments, the optical functional layer OFL may include black matrix and color filters. The color filters may be formed by taking into account a color of light emitted from each of pixels in the display device 10. Each of the color filters may include a red, green, or blue pigment or dye. Alternatively, each of the color filters may further include quantum dots, in addition to the pigment or the dye described above. Alternatively, some of the color filters might not include the pigment or the dye described above and may include scattered particles, such as titanium oxide.

According to some embodiments, the optical function member OFL may include a destructive interference structure. The destructive interference structure may include a first reflective layer and a second reflective layer located on different layers from each other. Destructive interference may occur to first reflective light and second reflective light reflected from the first reflective layer and the second reflective layer, respectively, and thus, the reflectivity of external light may be decreased.

A process of forming the optical function member OFL may be sequentially performed after a process of forming the touch sensing member TSL. In this case, an adhesive film, such as an optical transparent adhesive member, might not be located between the optical function member OFL and the touch sensing member TSL. According to some embodiments, the process of forming the optical function member OFL may be separately performed from the process of forming the touch sensing member TSL. In this case, an adhesive film, such as an optical transparent adhesive member, may be located between the optical function member OFL and the touch sensing member TSL.

Figure 4A:
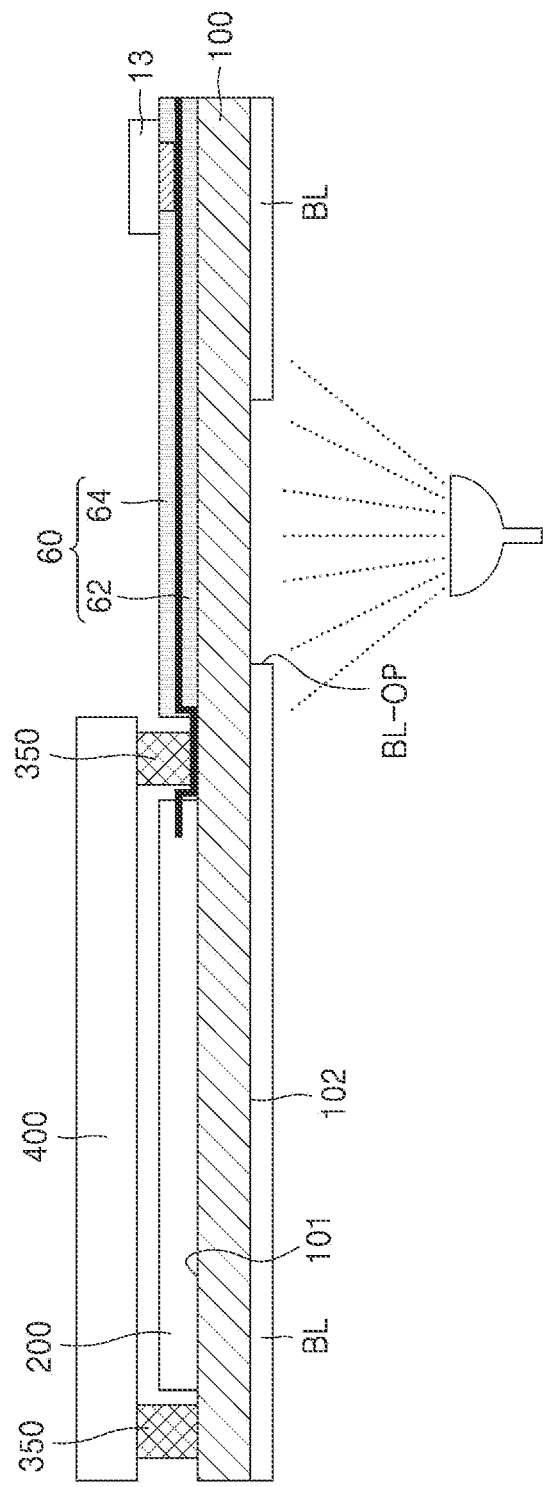
FIG. 4A is a cross-sectional view for schematically illustrating a process of manufacturing a display device, according to an embodiment.
Figure 4B:
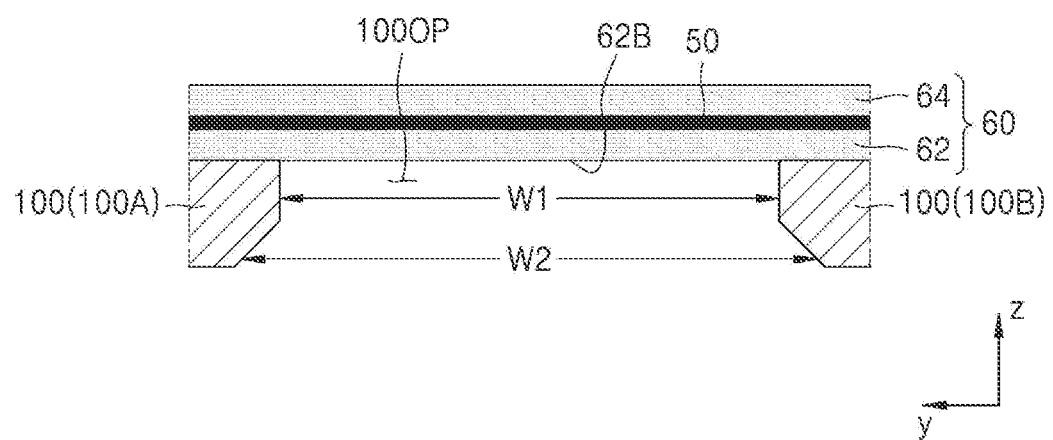
FIG. 4B is a cross-sectional view illustrating a portion of a display device according to an embodiment.

FIG. 4A is a cross-sectional view for schematically illustrating a process of manufacturing a display device, according to some embodiments, and FIG. 4B is a cross-sectional view illustrating a portion of a display device according to some embodiments.

Referring to FIG. 4A, first, the components, for example, the display layer 200, the encapsulation substrate 400, the sealing member 350, and the organic material layer 60 may be formed on a first surface 101 of the substrate 100. Thereafter, a blocking layer BL having an opening portion BL-OP may be formed on a second surface 102 of the substrate 100. The blocking layer BL may have the opening portion BL-OP by forming a layer including a photosensitive material, for example, a photosensitive organic material, and then, exposing and developing an area of the layer. Next, a portion of the substrate 100, the portion being exposed through the opening portion BL-OP of the blocking layer BL, may be etched to form the opening 100OP in the substrate 100 as illustrated in FIG. 4B. The second surface 62B of the first organic material layer 62 may be exposed through the opening 100OP. The etching process may be performed by using gas, an etchant, or the like for etching the substrate 100 including Si. Also, since the organic material layer 60 includes a different material from the substrate 100, the first organic material layer 62 might not be etched and may remain during the process of etching the substrate 100.

Referring to FIG. 4B, the opening 100OP of the substrate 100 may have a width that is not constant in a thickness direction. For example, a first width W1 of an upper portion (a proximal portion) of the opening 100OP adjacent to the first organic material layer 62 may be less than a second width W2 of a lower portion (an end portion) of the opening 100OP. It is described above that the second surface 62B of the first organic material layer 62 may be exposed through the opening 100OP.

Figure 5:
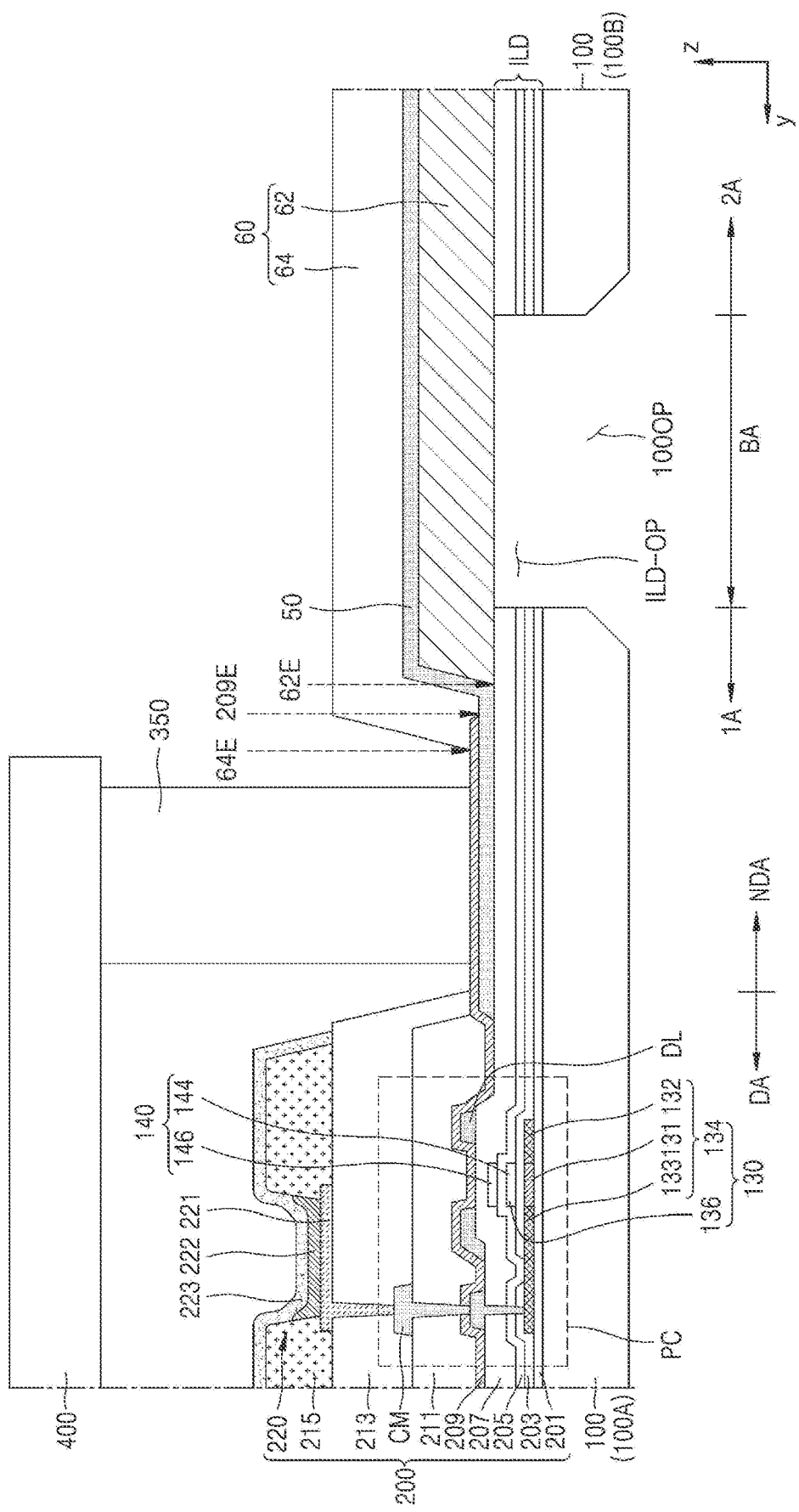
FIG. 5 is a cross-sectional view illustrating a portion of a display device according to another embodiment.

FIG. 5 is a cross-sectional view illustrating a portion of a display device according to some embodiments. FIG. 5 describes a cross-section of the display device before the display device is bent, for convenience.

Referring to FIG. 5, the display layer 200 may be located on the first portion 100A of the substrate 100 and the display layer 200 may include a pixel circuit PC and an organic light-emitting diode 220 connected to the pixel circuit PC.

A buffer layer 201 may be located between the first portion 100A of the substrate 100 and the pixel circuit PC.

The buffer layer 201 may prevent foreign materials or moisture from penetrating through the substrate 100. The buffer layer 201 may include an inorganic insulating material, for example, silicon oxide, silicon nitride, and/or silicon oxynitride and may include a single layer or multiple layers including the materials described above.

The pixel circuit PC may include a transistor 130 and a storage capacitor 140. The transistor 130 may include a semiconductor layer 134 and a gate electrode 136. The semiconductor layer 134 may include, for example, polysilicon. The semiconductor layer 134 may include a channel area 131 overlapping the gate electrode 136 and a source area 132 and a drain area 133 located at both sides of the channel area 131 and including impurities of a higher concentration than impurities in the channel area 131. Here, the impurities may include N-type impurities or P-type impurities. The source area 132 and the drain area 133 and metal layers respectively connected to the source area 132 and the drain area 133 may be a source electrode and a drain electrode of the transistor 130, respectively. According to some embodiments, the semiconductor layer 134 may include amorphous silicon, an oxide semiconductor, or an organic semiconductor.

The gate electrode 136 may include a low-resistance metal material. The gate electrode 136 may include a conductive material including Mo, Al, Cu, Ti, etc. and may include multiple layers or a single layer including the conductive materials described above. According to some embodiments, the gate electrode 136 may include a metal layer including Mo.

A gate insulating layer 203 may be located between the semiconductor layer 134 and the gate electrode 136. The gate insulating layer 203 may include an inorganic insulating material, for example, silicon oxide, silicon nitride, and/or silicon oxynitride and may include a single layer or multiple layers including the materials described above.

The storage capacitor 140 may include a first electrode 144 and a second electrode 146 overlapping each other. A first interlayer insulating layer 205 may be located between the first electrode 144 and the second electrode 146. The first interlayer insulating layer 205 may include an inorganic insulating material, for example, silicon oxide, silicon nitride, and/or silicon oxynitride and may include a single layer or multiple layers including the materials described above. The second electrode 146 may include a conductive material including Mo, Al, Cu, Ti, etc. and may include multiple layers or a single layer including the conductive materials described above. According to some embodiments, the second electrode 146 may include a metal layer including Mo.

FIG. 5 illustrates the case in which the storage capacitor 140 overlaps the transistor 130, and the first electrode 144 is the gate electrode 136 of the transistor 130. However, the disclosure is not limited thereto. According to some embodiments, the storage capacitor 140 might not overlap the transistor 130. The first electrode 144 may be a separate component that is different from the gate electrode 136 of the transistor 130.

The storage capacitor 140 may be covered by a second interlayer insulating layer 207. The second interlayer insulating layer 207 may include an inorganic insulating material, for example, silicon oxide, silicon nitride, and/or silicon oxynitride and may include a single layer or multiple layers including the materials described above.

A data line DL may be located on the second interlayer insulating layer 207 and covered by a first organic insulating layer 211. The data line DL may include a conductive material including Mo, Al, Cu, Ti, etc. and may include multiple layers or a single layer including the conductive materials described above. According to some embodiments, the data line DL may include multiple layers (Ti/Al/Ti) in which a Ti layer, an Al layer, and a Ti layer are sequentially stacked. The first organic insulating layer 211 may include an organic insulating material. For example, the first organic insulating layer 211 may include polyimide.

A third interlayer insulating layer 209 may be located below the first organic insulating layer 211, as a passivation layer. The third interlayer insulating layer 209 may include an inorganic insulating material, for example, silicon oxide, silicon nitride, and/or silicon oxynitride and may include a single layer or multiple layers including the materials described above.

A contact metal layer CM electrically connecting the transistor 130 and a pixel electrode 221 of the organic light-emitting diode 220 may be located on the first organic insulating layer 211. The contact metal layer CM may include a conductive material including Mo, Al, Cu, Ti, etc. and may include multiple layers or a single layer including the conductive materials described above. According to some embodiments, the contact metal layer CM may include multiple layers (Ti/Al/Ti) in which a Ti layer, an Al layer, and a Ti layer are sequentially stacked. According to some embodiments, the contact metal layer CM may be omitted.

The pixel electrode 221 may be located on a second organic insulating layer 213. The pixel electrode 221 may include a reflective layer including Ag, Mg, Al, Pt, Pd, Au, Ni, Nd, Ir, Cr, or the like. The pixel electrode 221 may further include a layer including ITO, IZO, ZnO or $In_2O_3$ above and/or below the reflective layer described above.

A pixel-defining layer 215 may be located on the pixel electrode 221 and may have an opening exposing a central portion of the pixel electrode 221. The pixel-defining layer 215 may increase a distance between an end of the pixel electrode 221 and an opposite electrode (or a common electrode) 223, thereby preventing the occurrence of arcs, etc. therebetween. The pixel-defining layer 215 may include an organic material, such as polyimide or hexamethyldisiloxane (HMDSO). Alternatively, the pixel-defining layer 215 may include an inorganic material.

An intermediate layer 222 may include an emission layer. The intermediate layer 222 may further include a first functional layer located below the emission layer and a second functional layer located above the emission layer. The intermediate layer 222 may include a low molecular-weight or a high molecular-weight material. The first functional layer may include a hole injection layer (HIL) and/or a hole transport layer (HTL). The second functional layer may include an electron transport layer (ETL) and an electron injection layer (EIL). At least any one of the layers included in the intermediate layer 222 may be formed as a single body in the display area DA. For example, the emission layer of the intermediate layer 222 may be located to overlap each pixel electrode, while the first functional layer and/or the second functional layer may be a common layer(s) formed as a single body to correspond to a plurality of pixels.

The opposite electrode 223 may be located on the intermediate layer 222. The opposite electrode 223 may be formed as a single body to cover the plurality of pixels. The common electrode 223 may include a transmissive conductive layer including Ag, Mg, Al, Pt, Pd, Au, Ni, Nd, Ir, Cr, Li, Ca, or an alloy thereof. A capping layer including LiF, an inorganic insulating material, and/or an organic insulating material may further be located on the opposite electrode 223.

The encapsulation substrate 400 may be arranged to face the first portion 100A of the substrate 100 and the sealing member 350 between the encapsulation substrate 400 and the first portion 100A may be located in the non-display area NDA.

The wiring layer 50 may include wires to apply signals and/or power to the display layer 200 as described above. The wiring layer 50 may be located on the same layer (the second interlayer insulating layer 207) as the data line DL as illustrated in FIG. 5 and may include the same material as the data line DL.

The wiring layer 50 may extend toward the second area 2A in the non-display area NDA. A first portion of the wiring layer 50 may overlap the sealing member 350 on the first portion 100A of the substrate 100, a second portion of the wiring layer 50 may cross the bending area BA, and a third portion of the wiring layer 50 may be located on the second portion 100B of the substrate 100. A first end of the wiring layer 50 may be covered by the third interlayer insulating layer 209 on the first area 1A or the first portion 100A of the substrate 100. Thus, the wiring layer 50 might not directly contact the sealing member 350. The wiring layer 50 may be located on the first organic material layer 62.

The first organic material layer 62 may be continually formed in a ty direction to be located on the first portion 100A and the second portion 100B of the substrate 100. The first organic material layer 62 may form a step difference with respect to an insulating layer therebelow, for example, the second interlayer insulating layer 207, and may be formed along the step difference of the wiring layer 50 described above. For example, the first portion of the wiring layer 50 may directly contact the third interlayer insulating layer 209 in the first area 1A and the second portion of the wiring layer 50 may directly contact the first organic material layer 62 in the bending area BA, wherein a level (a vertical distance from a plane the same as a first surface of the substrate) of the first portion of the wiring layer 50 may be different from a level (the vertical distance from the plane the same as the first surface of the substrate) of the second portion of the wiring layer 50. A first end (first edge) 62E of the first organic material layer 62, which is adjacent to the display area DA, may overlap an end portion of the first portion 100A of the substrate 100 and may be apart from an outer surface of the sealing member 350 by a certain distance.

The wiring layer 50 may be covered by the second organic material layer 64. The second organic material layer 64 may cover an end portion of the third interlayer insulating layer 209, which is adjacent to the bending area BA. With respect to this aspect, FIG. 5 illustrates that a first end (first edge) 64E of the second organic material layer 64 is located more adjacent to the sealing member 350 than an end (or edge) 209E of the third interlayer insulating layer 209, which is adjacent to the bending area BA. The first end 64E of the second organic material layer 64 may be apart from the sealing member 350 by a certain distance.

The second organic material layer 64 may be simultaneously formed during a process of forming the display layer 200. For example, the second organic material layer 64 may be simultaneously formed during a process of forming the first organic insulating layer 211 or the second organic insulating layer 213 and may include the same material as the first organic insulating layer 211 or the second organic insulating layer 213.

The first organic material layer 62 and the second organic material layer 64 may support or protect the wiring layer 50 and may alleviate the stress generated due to bending of the display device. The first organic material layer 62 and the second organic material layer 64 may include an imide-based polymer, a general-purpose polymer, such as PMMA or PS, a polymer derivative having a phenol-based group, an acryl-based polymer, an aryl ether-based polymer, an amide-based polymer, a fluorine-based polymer, a p-xylene-based polymer, a vinyl alcohol-based polymer, and a blend thereof. The first organic material layer 62 and the second organic material layer 64 may include the same material as each other or a different material from each other.

The substrate 100 may have the opening 100OP located in the bending area BA as described above, at least one inorganic insulating layer ILD may be provided on the substrate 100, and the at least one inorganic insulating layer ILD may have an opening ILD-OP overlapping the opening 100OP. The opening ILD-OP of the at least one inorganic insulating layer ILD may be simultaneously formed during a process of forming the opening 100OP of the substrate 100 or may be formed in a process different from the process of forming the opening 100OP of the substrate 100. The at least one inorganic insulating layer ILD may include the element Si, and thus, when a portion of the substrate 100 including the element Si is removed, a portion of the at least one inorganic insulating layer ILD may also be removed during the process (for example, an etching process) of forming the opening 100OP. For example, the opening ILD-OP of the at least one inorganic insulating layer ILD on the substrate 100 may be formed together during the process of forming the opening 100OP of the substrate 100.

The at least one inorganic insulating layer ILD may include one or more from among, for example, the buffer layer 201, the gate insulating layer 203, the first interlayer insulating layer 205, and the second interlayer insulating layer 207. According to some embodiments, FIG. 5 illustrates that the at least one inorganic insulating layer ILD includes the buffer layer 201, the gate insulating layer 203, the first interlayer insulating layer 205, and the second interlayer insulating layer 207. Hereinafter, for convenience of explanation, it is described that the at least one inorganic insulating layer ILD includes the buffer layer 201, the gate insulating layer 203, the first interlayer insulating layer 205, and the second interlayer insulating layer 207.

In the process of bending the display device as illustrated in FIG. 3, a layer(s) including an inorganic material is relatively vulnerable with respect to the bending process, and thus, cracks may occur. However, when the inorganic insulating layer ILD includes the opening ILD-OP in the bending area BA, according to some embodiments, the occurrence of cracks or penetration of water, etc., through the cracks may be prevented.

Figure 6:
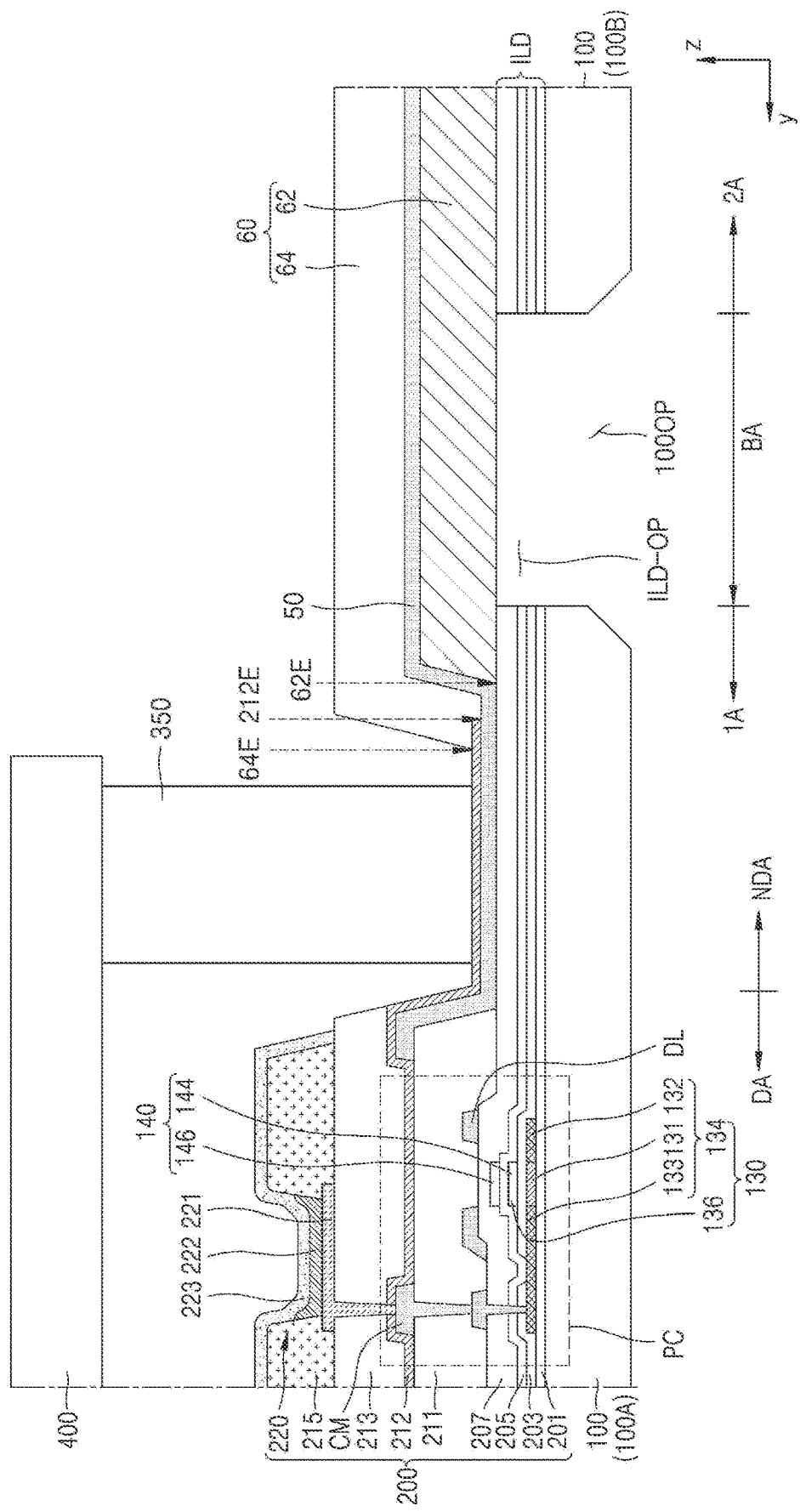
FIG. 6 is a cross-sectional view illustrating a portion of a display device according to another embodiment.

FIG. 6 is a cross-sectional view illustrating a portion of a display device according to some embodiments. FIG. 6 describes the cross-section of the display device before the display device is bent, for convenience.

According to some embodiments, as illustrated in FIG. 6, a location of the wiring layer 50 may be different from the location of the wiring layer 50 described with reference to FIG. 5, and the display layer 200 may include a fourth interlayer insulating layer 212 between the first organic insulating layer 211 and the second organic insulating layer 213. Hereinafter, for convenience of explanation, descriptions will be given by focusing on differences.

Referring to FIG. 6, the wiring layer 50 may be formed together during the same process as the contact metal layer CM and may include the same material as the contact metal layer CM. A first end portion of the wiring layer 50, which is adjacent to the organic light-emitting diode 220, may be located on the first organic insulating layer 211. The wiring layer 50 may be covered by the fourth interlayer insulating layer 212. Thus, the wiring layer 50 might not directly contact the sealing member 350. The wiring layer 50 may be located on the first organic material layer 62.

The first organic material layer 62 may form a step difference with respect to an insulating layer therebelow, for example, the second interlayer insulating layer 207, and the wiring layer 50 may be formed along the step difference described above. A first portion of the wiring layer 50 may directly contact the first organic insulating layer 211 and the fourth interlayer insulating layer 212 in the first area 1A and a second portion of the wiring layer 50 may directly contact the first organic material layer 62 in the bending area BA, wherein a level of the first portion of the wiring layer 50 and a level of the second portion of the wiring layer 50 may be different from each other.

The wiring layer 50 may be covered by the second organic material layer 64, and the first end (first edge) 64E of the second organic material layer 64 may be located more adjacent to the sealing member 350 than an end (an edge) 212E of the fourth interlayer insulating layer 212, which is adjacent to the bending area BA.

Each of the first organic material layer 62 and the second organic material layer 64 may be formed together during a process of forming the display layer 200. For example, the first organic material layer 62 may be formed together during a process of forming the first organic insulating layer 211 and may include the same material as the first organic insulating layer 211. The second organic material layer 64 may be formed together during a process of forming the second organic insulating layer 213 and may include the same material as the second organic insulating layer 213.

Figure 7:
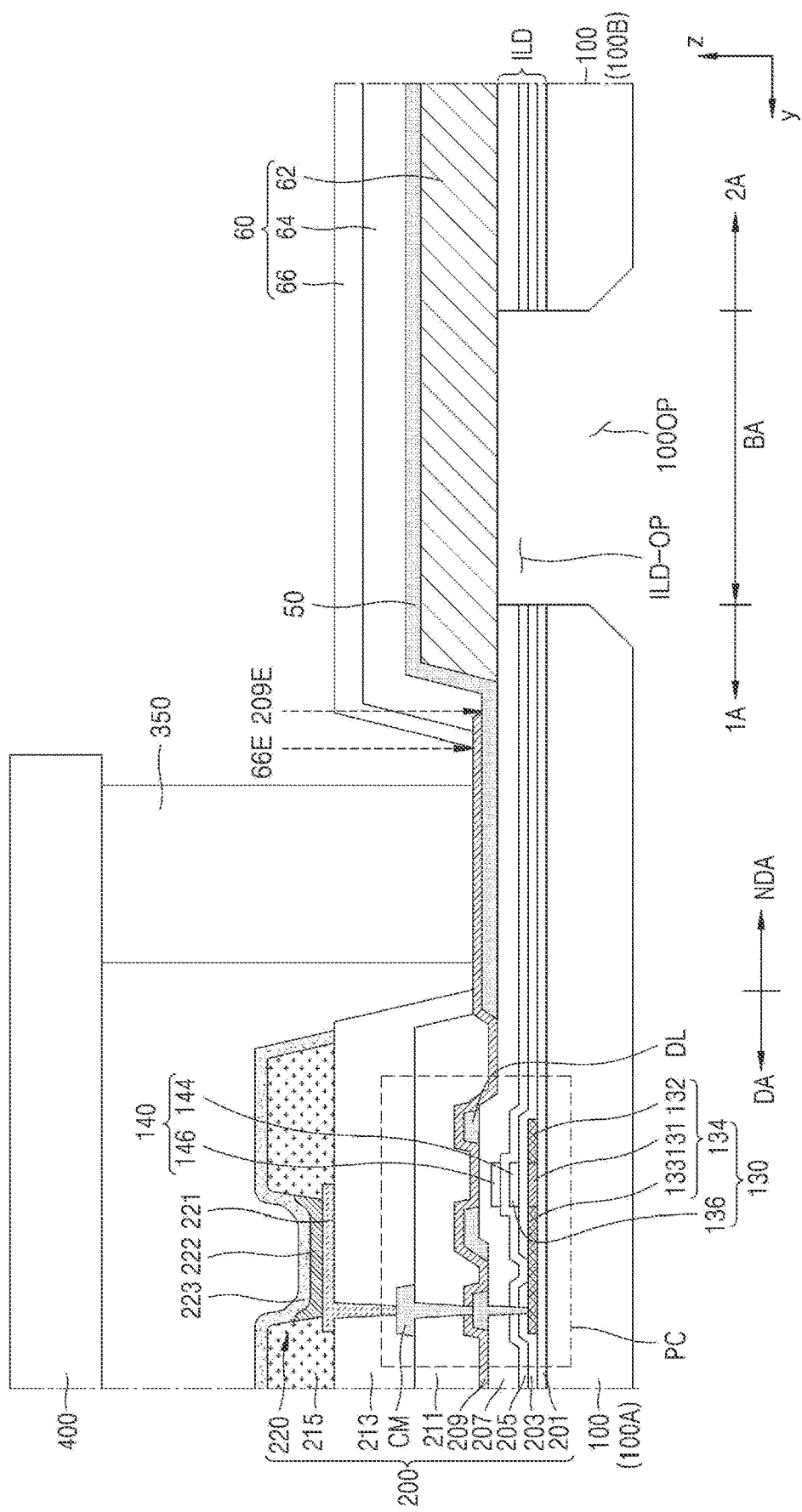
FIG. 7 is a cross-sectional view illustrating a portion of a display device according to another embodiment.
Figure 8:
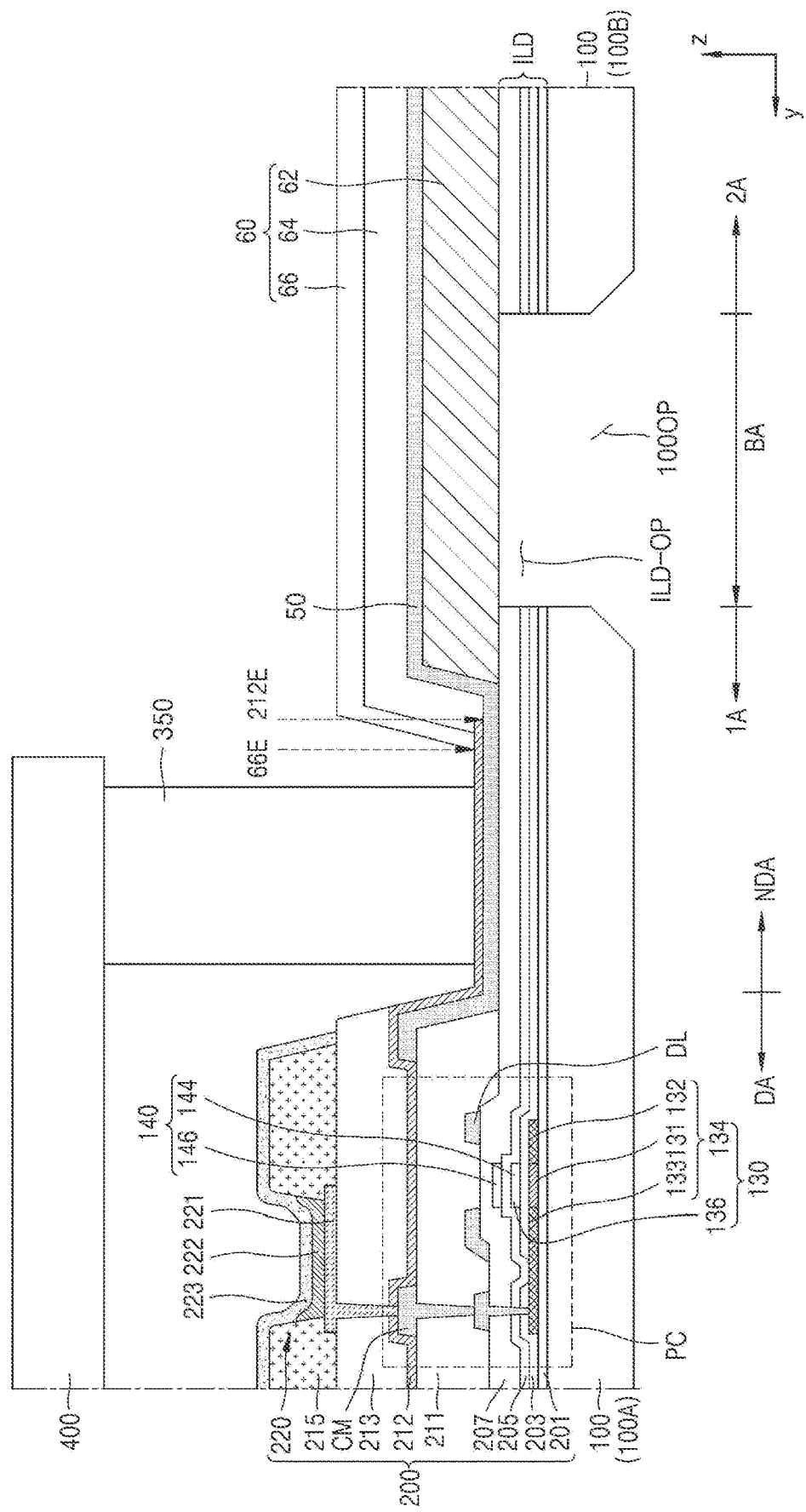
FIG. 8 is a cross-sectional view illustrating a portion of a display device according to another embodiment.

Each of FIGS. 7 and 8 is a cross-sectional view illustrating a portion of a display device according to some embodiments. FIGS. 7 and 8 describe the cross-section of the display device before the display device is bent, for convenience.

The embodiments described with respect to FIG. 7 are the same as the embodiments described with reference to FIG. 5, except a stacked structure of the organic material layer 60. Similarly, the embodiments described with respect to FIG. 8 are the same as the embodiments described with respect to FIG. 6, except a stacked structure of the organic material layer 60. Thus, hereinafter, for convenience of explanation, descriptions will be given by focusing on the organic material layer 60, and the descriptions about the same components will not be repeated.

Referring to FIGS. 7 and 8, the organic material layer 60 may include a third organic material layer 66 on the second organic material layer 64. The third organic material layer 66 may include a general-purpose polymer, such as PMMA or PS, a polymer derivative having a phenol-based group, an acryl-based polymer, an aryl ether-based polymer, an amide-based polymer, a fluorine-based polymer, a p-xylene-based polymer, a vinyl alcohol-based polymer, and a blend thereof. The first organic material layer 62, the second organic material layer 64, and the third organic material layer 66 may include the same material as one another or a different material from one another.

The third organic material layer 66 may be formed together during the same process as the second organic insulating layer 213 or the pixel-defining layer 215 of the display layer 200 and may include the same material as the second organic insulating layer 213 or the pixel-defining layer 215. An end (an edge) 66E of the third organic material layer 66, which is adjacent to the display area DA, may be located more adjacent to the display area DA than the end (the edge) 209E (FIG. 7) of the third interlayer insulating layer 209 or the end (the edge) 212E (FIG. 8) of the fourth interlayer insulating layer 212. The end (edge) 66E of the third organic material layer 66 may be apart from the sealing member 350.

FIGS. 7 and 8 describe that the organic material layer 60 includes three layers. However, the disclosure is not limited thereto. According to some embodiments, the organic material layer 60 may include four or more layers. When the organic material layer 60 includes three or more layers, stress may be more effectively alleviated.

FIGS. 9A through 9E are cross-sectional views extracting and illustrating the bending area BA of a display device according to embodiments.

Figure 9A:
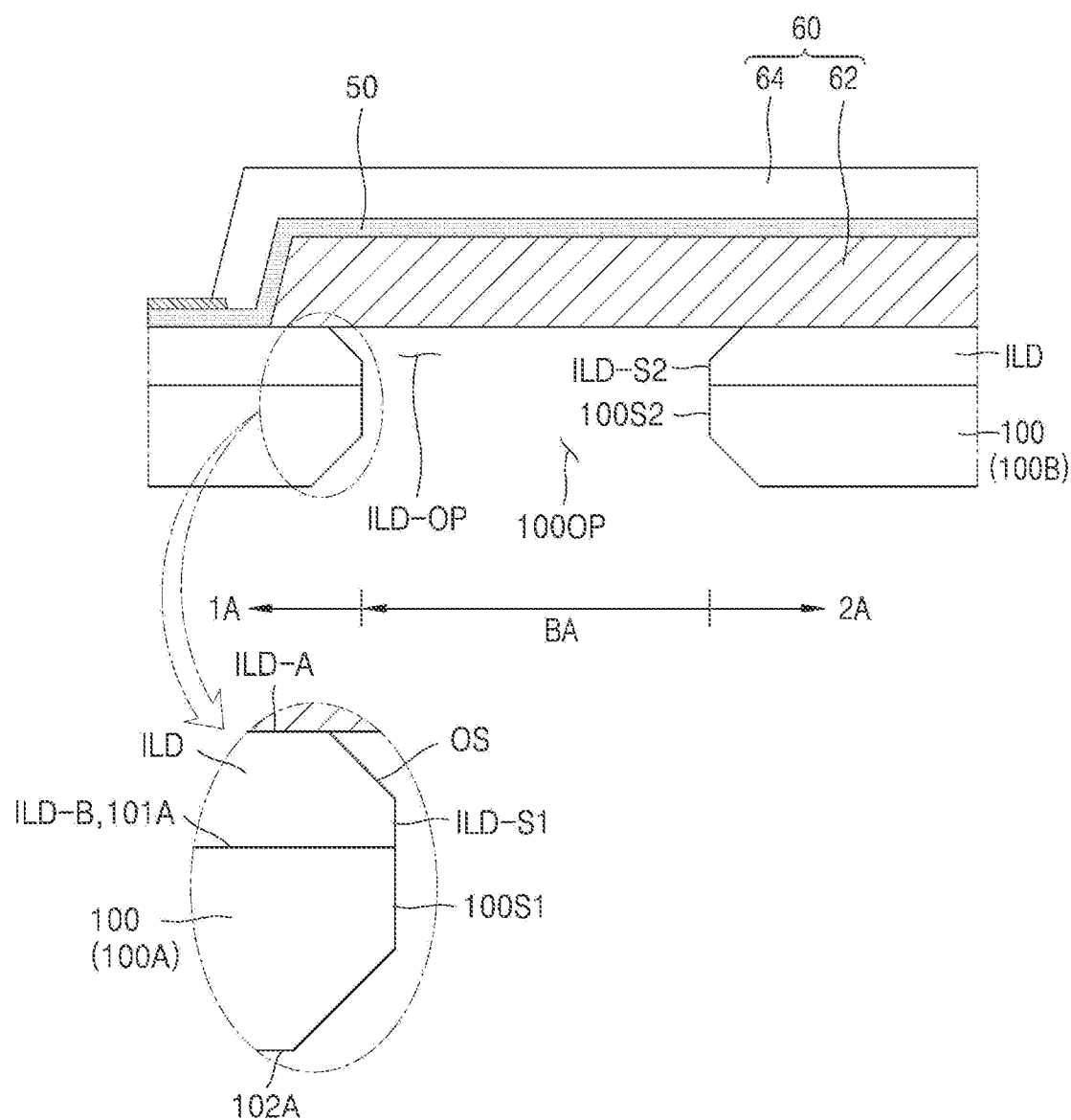
FIGS. 9A through 9E are respectively cross-sectional views illustrating a bending area of a display device that is extracted, according to an embodiment.

According to some embodiments, referring to FIG. 9A, the substrate 100 and the inorganic insulating layer ILD may respectively include the openings 100OP and ILD-OP located in the bending area BA. As described above with reference to FIG. 4B, a width of a proximal portion of the opening 100OP of the substrate 100 may be less than a width of an end portion of the opening 100OP of the substrate 100.

For example, the first portion 100A of the substrate 100 may include the first surface 101A facing the display layer 200 and the second surface 102A that is the opposite to the first surface 101A and may include a first side surface 100S1 and a second side surface 100S2 defining the opening 100OP. The first side surface 100S1 may connect the first surface 101A to the second surface 102A and may include an oblique surface forming an obtuse angle with the second surface 102A. Like the first side surface 100S1, the second side surface 100S2 may also include an oblique surface.

In the opening ILD-OP of the inorganic insulating layer ILD, a width of a proximal portion adjacent to the first organic material layer 62 may be greater than a width of a distal portion far from the first organic material layer 62, in a thickness direction of the inorganic insulating layer ILD. The inorganic insulating layer ILD may have a first surface ILD-A facing the first organic material layer 62 and a second surface ILD-B that is the opposite to the first surface ILD-A and may include a first side surface ILD-S1 and a second side surface ILD-S2 defining the opening ILD-OP. The first side surface ILD-S1 may connect the first surface ILD-A to the second surface ILD-B and may include an oblique surface OS that is tapered in a reverse direction with respect to the first surface ILD-A, for example, the oblique surface OS forming an obtuse angle with the first surface ILD-A. Like the first side surface ILD-S1, the second side surface ILD-S2 may also include an oblique surface.

When the first side surface ILD-S1 and/or the second side surface ILD-S2 of the inorganic insulating layer ILD include(s) the oblique surface OS described above, during the bending of the display device, for example, the bending of the organic material layer 60 may be easily realized and a radius of curvature of the organic material layer 60 that is bent may be decreased. Thus, as illustrated in FIG. 3, an area in a y direction, which is occupied by the bending area BA or a width in the y direction, which is occupied by the bending area BA, in the display device that is bent, may further be decreased.

In FIG. 9A, it is described that a portion of each of the first side surface 100S1 and the second side surface 100S2 of the substrate 100, the first and second side surfaces 100S and 100S2 defining the opening 100OP, may include the oblique surface, and a portion of each of the first side surface ILD-S1 and the second side surface ILD-S2 of the inorganic insulating layer ILD, the first and second side surfaces ILD-S1 and ILD-S2 defining the opening ILD-OP, may include the oblique surface OS. However, the disclosure is not limited thereto.

Figure 9B:
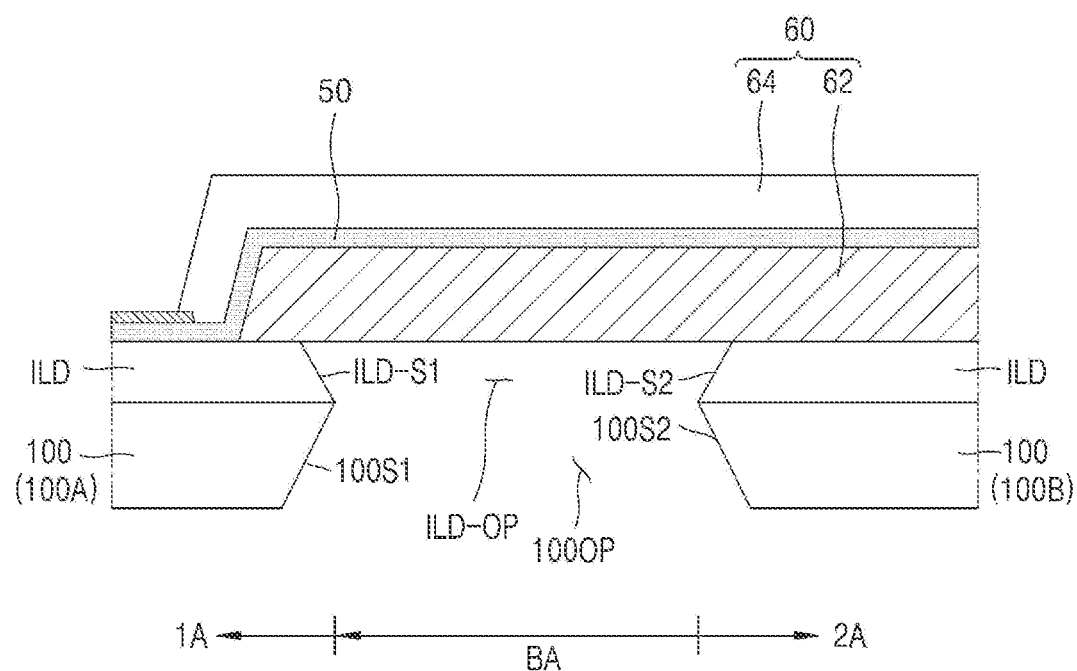

According to some embodiments, as illustrated in FIG. 9B, each of the first side surface 100S1 and the second side surface 100S2 of the substrate 100, the first and second side surfaces 100S1 and 100S2 defining the opening 100OP, may have an overall oblique surface. Similarly, each of the first side surface ILD-S1 and the second side surface ILD-S2 of the inorganic insulating layer ILD, the first and second side surfaces ILD-S1 and ILD-S2 defining the opening ILD-OP, may have an overall oblique surface.

Figure 9C:
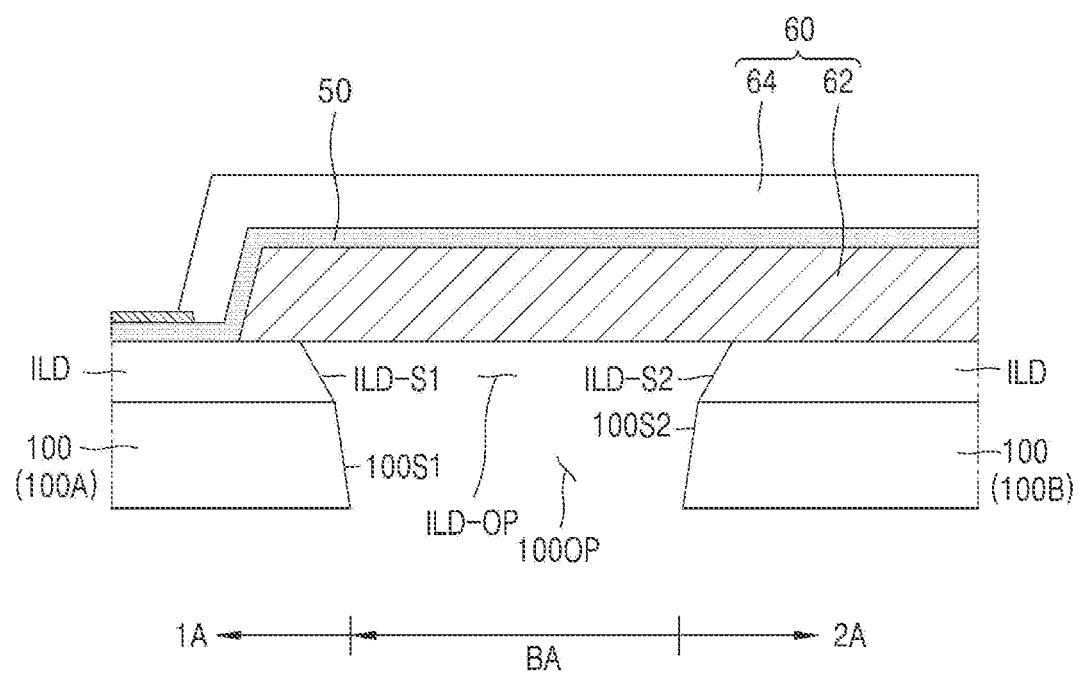

FIG. 9B illustrates that the oblique surface of the substrate 100 and the oblique surface of the inorganic insulating layer ILD are tapered in opposite directions to each other. However, the disclosure is not limited thereto. According to some embodiments, as illustrated in FIG. 9C, an oblique surface of the substrate 100 and an oblique surface of the inorganic insulating layer ILD may be tapered in the same direction, but the angles (tapered angles) may be different from each other. For example, the tapered angle of the first side surface 100S1 of the substrate 100, which defines the opening 100OP, may have a greater value than the tapered angle of the first side surface ILD-S1 of the inorganic insulating layer ILD, which defines the opening ILD-OP. Alternatively, the tapered angle of the first side surface 100I of the substrate 100, which defines the opening 100OP, may have a smaller or substantially the same value than or as the tapered angle of the first side surface ILD-S1 of the inorganic insulating layer ILD, which defines the opening ILD-OP.

Figure 9D:
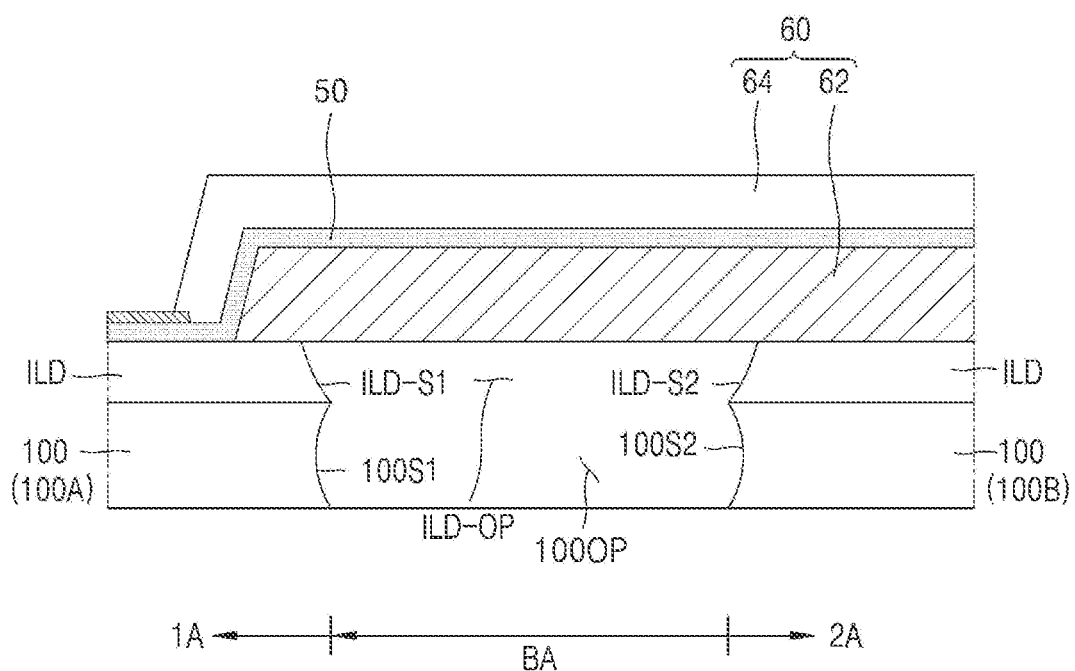

Each of FIGS. 9A through 9C illustrates that the first side surface 100I and the second side surface 100S2 of the substrate 100 and the first side surface ILD-S1 and the second side surface ILD-S2 of the inorganic insulating layer ILD include approximately flat oblique surfaces. However, the disclosure is not limited thereto. According to some embodiments, as illustrated in FIG. 9D, the first side surface 100S and the second side surface 100S2 of the substrate 100, and the first side surface ILD-S1 and the second side surface ILD-S2 of the inorganic insulating layer ILD may include curved surfaces.

Figure 9E:
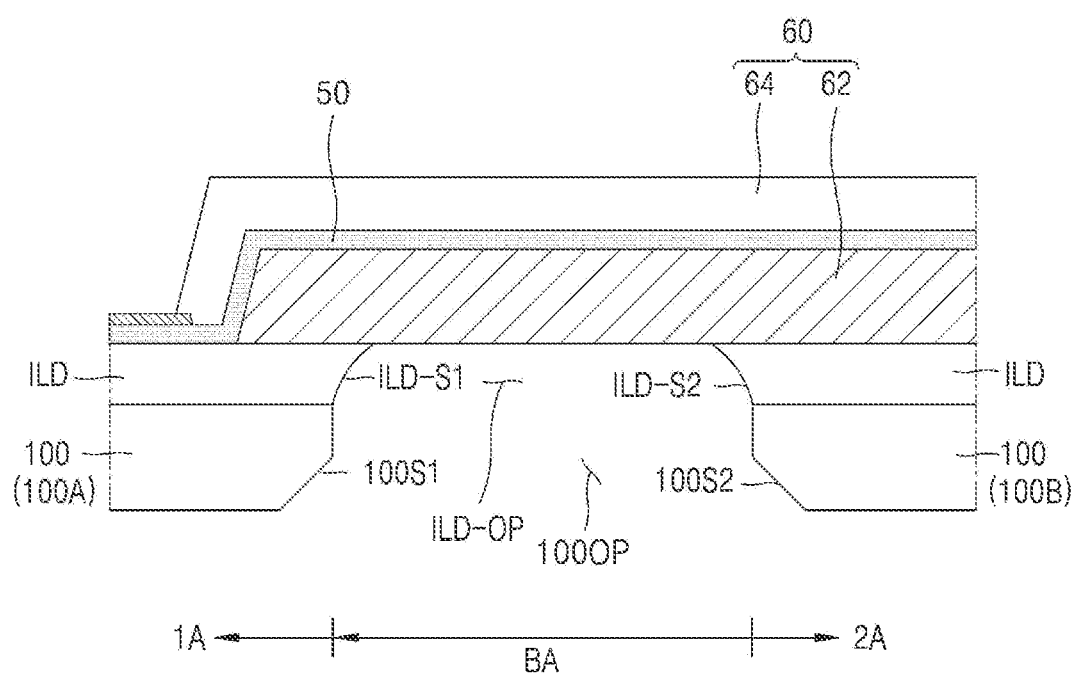

FIGS. 9A through 9C illustrate that the first side surface ILD-S1 and the second side surface ILD-S2 of the inorganic insulating layer ILD include the oblique surfaces tapered in the reverse direction with respect to the first surface ILD-A of the inorganic insulating layer ILD. However, the disclosure is not limited thereto. According to some embodiments, as illustrated in FIG. 9E, the first side surface ILD-S1 and the second side surface ILD-S2 of the inorganic insulating layer ILD may have oblique surfaces tapered in a forward direction with respect to the first surface ILD-A of the inorganic insulating layer ILD. Alternatively, the first side surface ILD-S1 and the second side surface ILD-S2 of the inorganic insulating layer ILD may include curved surfaces. The case in which the first side surface ILD-S1 and the second side surface ILD-S2 of the inorganic insulating layer ILD include the oblique surfaces tapered in the reverse direction may be more preferable than the case in which the first side surface ILD-S1 and the second side surface ILD-S2 of the inorganic insulating layer ILD include the oblique surfaces tapered in the forward direction, in terms of the bending of the organic material layer 60.

According to some embodiments, the first side surface 100S and the second side surface 100S2 of the substrate 100, the first and second side surfaces 100S and 100S2 defining the opening 100OP, and the first side surface ILD-S1 and the second side surface ILD-S2 of the inorganic insulating layer ILD, the first and second side surfaces ILD-S1 and ILD-S2 defining the opening ILD-OP, each may have the shape described according to the embodiments described with reference to FIGS. 9A through 9E. For example, the first side surface 100I and the second side surface 100S2 of the substrate 100, the first and second side surfaces 100S1 and 100S2 defining the opening 100OP, may have the shape described with reference to FIG. 9C and the first side surface ILD-S1 and the second side surface ILD-S2 of the inorganic insulating layer ILD, the first and second side surfaces ILD-S1 and ILD-S2 defining the opening ILD-OP, may have the shape described with reference to FIG. 9E. Like this, the shape described with reference to the embodiments described above and the shapes derived from the embodiments described above may also correspond to embodiments.

Figure 10:
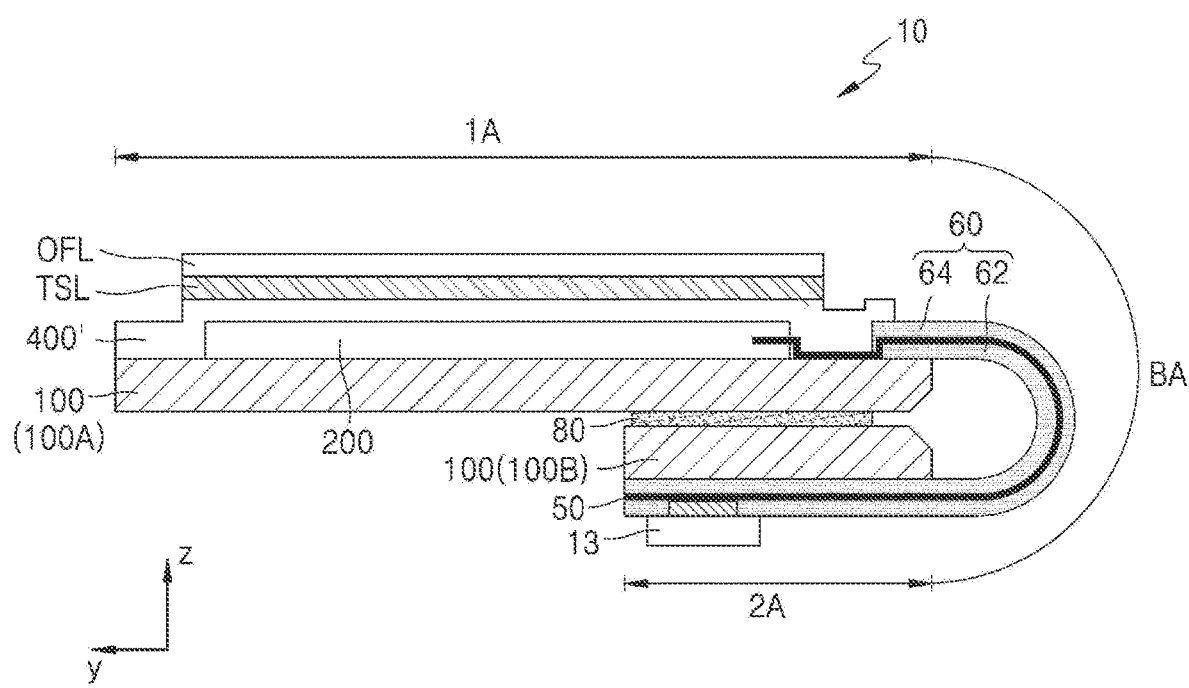
FIG. 10 is a cross-sectional view schematically illustrating a display device according to another embodiment.

FIG. 10 is a cross-sectional view schematically illustrating a display device 10 according to some embodiments.

The embodiments described with respect to FIG. 10 may include substantially the same components as the embodiments described above with reference to FIG. 3. However, the embodiments described with respect to FIG. 10 may be different from the embodiments of FIG. 3 in that the embodiments of FIG. 10 may include a thin film encapsulation layer 400' rather than the encapsulation substrate 400 (FIG. 3), as an encapsulation member. The same components are described above, and thus, will not be repeatedly described and descriptions will be given by focusing on the different aspect.

The thin film encapsulation layer 400' may include at least one organic encapsulation layer and at least one inorganic encapsulation layer. The at least one organic encapsulation layer and the at least one in organic encapsulation layer may be alternately stacked. The display device 10 including the thin film encapsulation layer 400' may have a less thickness than the display device 10 including the encapsulation substrate 400. A touch sensing member TSL and an optical functional member OFL may be located on the thin film encapsulation layer 400'.

Figure 11:
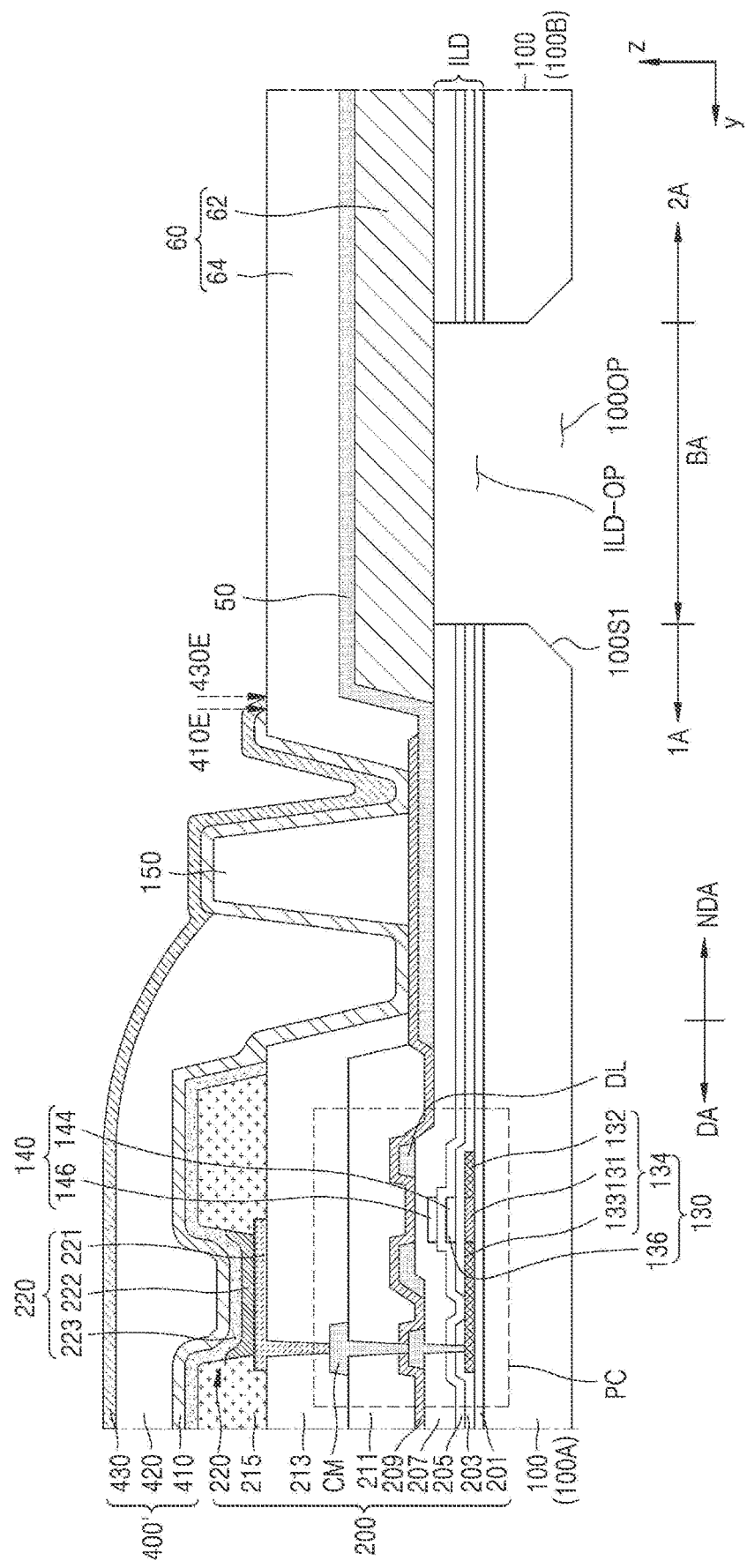
FIG. 11 is a cross-sectional view schematically illustrating a display device according to another embodiment.

FIG. 11 is a cross-sectional view schematically illustrating a display device according to some embodiments. FIG. 11 describes the cross-section of the display device before the display device is bent, for convenience.

Referring to FIG. 11, the substrate 100 may have the opening 100OP corresponding to the bending area BA and the first portion 100A and the second portion 100B apart from each other based on the opening 100OP. The display layer 200 may be located on the first portion 100A of the substrate 100 and a detailed structure of the display layer 200 is described above with reference to FIG. 5.

The organic light-emitting diode 220 may be covered by the thin film encapsulation layer 400'. According to some embodiments, the thin film encapsulation layer 400' may include a first inorganic encapsulation layer 410, an organic encapsulation layer 420, and a second inorganic encapsulation layer 430.

The first inorganic encapsulation layer 410 and the second inorganic encapsulation layer 430 may include one or more inorganic insulating material, such as aluminum oxide, titanium oxide, tantalum oxide, hafnium oxide, zinc oxide, silicon oxide, silicon nitride, or silicon oxynitride, and may be formed based on chemical vapor deposition (CVD), etc.

The organic encapsulation layer 420 may include a polymer-based material. The polymer-based material may include silicon-based resins, acryl-based resins, epoxy-based resins, polyimide, and polyethylene. An end portion of the organic encapsulation layer 420 may be arranged to be adjacent to a first side surface of a partition wall 150 facing the display area DA. The first inorganic encapsulation layer 410 and the second inorganic encapsulation layer 430 may extend toward the bending area BA beyond the partition wall 150, while each of a distal end 410E of the first inorganic encapsulation layer 410 and a distal end 430E of the second inorganic encapsulation layer 430 may be located on the first portion 100A of the substrate 100. In other words, each of the distal end 410E of the first inorganic encapsulation layer 410 and the distal end 430E of the second inorganic encapsulation layer 430 may be located more adjacent to the display area DA than an edge of the first portion 100A of the substrate 100. The first inorganic encapsulation layer 410 and the second inorganic encapsulation layer 430 may extend onto the organic material layer 60, for example, the second organic material layer 64.

The wiring layer 50 may extend toward the second area 2A in the non-display area NDA as described with reference to FIG. 5 and the wiring layer 50 may be located on the second interlayer insulating layer 207. The characteristics of the wiring layer 50 and the characteristics of the first organic material layer 62 and the second organic material layer 64 located below and above the wiring layer 50 are described above with reference to FIG. 5.

The partition wall 150 may be located in the non-display area NDA and may overlap the wiring layer 50 in the first area 1A. An inorganic insulating layer, for example, the third interlayer insulating layer 209 covering a portion of the wiring layer 50, may be located between the partition wall 150 and the wiring layer 50. The partition wall 150 may be formed during a process of forming the display layer 200. For example, the partition wall 150 may include a sub-layer (s) formed in the same process as the first organic insulating layer 211, the second organic insulating layer 213, and/or the pixel-defining layer 215.

Figure 12:
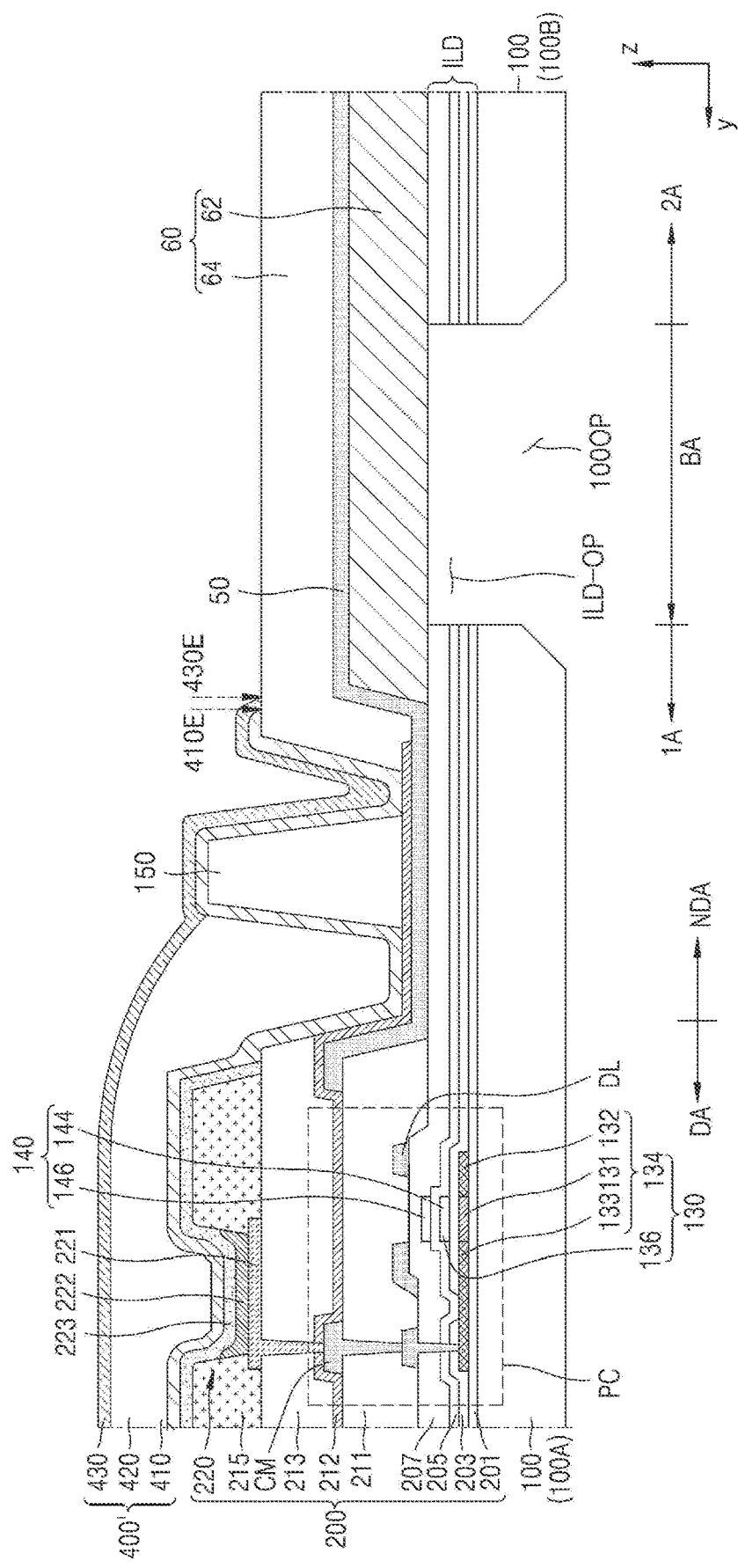
FIG. 12 is a cross-sectional view schematically illustrating a display device according to another embodiment.

FIG. 12 is a cross-sectional view schematically illustrating a display device according to some embodiments. FIG. 12 describes the cross-section of the display device before the display device is bent, for convenience.

Referring to FIG. 12, it is the same as FIG. 11 above that the thin film encapsulation layer 400' is located on the display layer 200 and the partition wall 150 is located on the non-display area NDA of the first area 1A. However, a location of the wiring layer 50 may be different from that in the embodiments described with respect to FIG. 11.

The wiring layer 50 may be formed together during the same process as the contact metal layer CM and may include the same material as the contact metal layer CM. A first end of the wiring layer 50, which is adjacent to the organic light-emitting diode 220, may be located on the first organic insulating layer 211. The wiring layer 50 may be covered by the fourth interlayer insulating layer 212.

The partition wall 150 may include a sub-layer(s) formed together during a process of forming the second organic insulating layer 213 and/or the pixel-defining layer 215. The partition wall 150 may overlap the wiring layer 50. An inorganic insulating layer, for example, the fourth interlayer insulating layer 212 covering a portion of the wiring layer 50, may be located between the partition wall 150 and the wiring layer 50. Thus, the wiring layer 50 might not directly contact the partition wall 150. The wiring layer 50 may be located on the first organic material layer 62 in the bending area BA and the characteristics of the wiring layer 50 and the characteristics of the first organic material layer 62 and the second organic material layer 64 located above and below the wiring layer 50 are described above.

Figure 13:
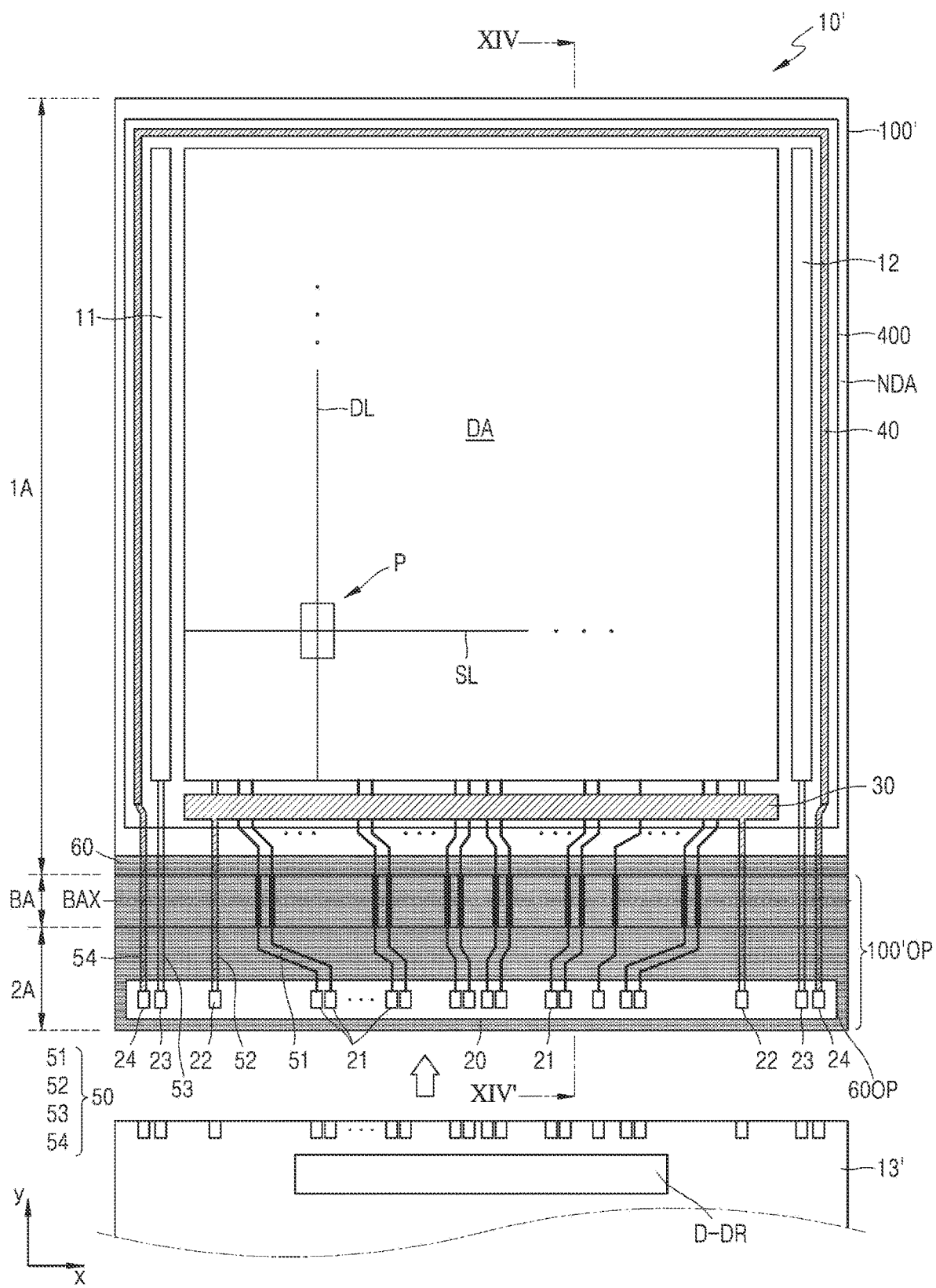
FIG. 13 is a plan view illustrating a display device according to an embodiment.

FIG. 13 is a plan view illustrating the display device 10' according to some embodiments.

Referring to FIG. 13, the display device 10' may include the first area 1A, the second area 2A, and the bending area BA between the first area 1A and the second area 2A. FIG. 13 may be a shape of a substrate 100'. For example, the substrate 100' may include the first area 1A, the second area 2A, and the bending area BA between the first area 1A and the second area 2A. Unlike the opening 100OP of the substrate 100 described above with reference to FIG. 1, the opening 100OP corresponding to the bending area BA, FIG. 13 illustrates that a portion of an opening 100'OP of the substrate 100' corresponds to the bending area BA. For example, the opening 100'OP of the substrate 100' may correspond to the bending area BA and the second area 2A. Because the opening 100'OP overlaps the bending area BA and the second area 2A, the substrate 100' may have an area substantially corresponding to the first area 1A.

The substrate 100' may include an organic material or an inorganic material. According to some embodiments, the substrate 100' may include a glass substrate mainly including a material including the element Si, for example, $SiO_2$.

The first area 1A may include the display area DA. The first area 1A may include the display area DA and a portion of a non-display area NDA outside the display area DA, as illustrated in FIG. 13. The second area 2A and the bending area BA may include the non-display area NDA. The display area DA of the display device 10' may correspond to a portion of the first area 1A and the non-display area NDA may correspond to the other portion of the first area 1A, the second area 2A, and the bending area BA.

The display area DA may be an area in which pixels P are located and the first scan driver 11, the second scan driver 12, the driving voltage supply line 30, and the common voltage supply line 40 may be located in the non-display area NDA of the first area 1A.

The terminal portion 20 and the wiring layer 50 may be located in the second area 2A of the non-display area NDA. The wiring layer 50 may be located between an end of the display area DA and the terminal portion 20 and may include the first wire 51, the second wire 52, the third wire 53, and the fourth wire 54 extending in a y direction.

Terminals 21, 22, 23, and 24 of the terminal portion 20 may be portions of the first through fourth wires 51 through 54, respectively. For example, an end portion of the first wire 51 may correspond to the terminal 21, an end portion of the second wire 52 may correspond to the terminal 22, an end portion of the third wire 53 may correspond to the terminal 23, and an end portion of the fourth wire 54 may correspond to the terminal 24.

The wiring layer 50 including the first through fourth wires 51 through 54 may be located on the organic material layer 60. The organic material layer 60 may be located to cover at least the bending area BA. According to some embodiments, the organic material layer 60 may have a certain area to cover the bending area BA and the second area 2A, while a side of the organic material layer 60 may be located in the first area 1A and the other side of the organic material layer 60 may be located in the second area 2A. The organic material layer 60 may include a plurality of sub-organic material layers and any one of the plurality of sub-organic material layers may have the opening 600P corresponding to the terminal portion 20.

The terminal portion 20 exposed through the opening 600P may be connected to a flexible printed circuit board (hereinafter, referred to as an FPCB) 13'. A data driver DDR providing data signals to the pixels P may be included in the FPCB 13'. For convenience of explanation, FIG. 13 illustrates that the FPCB 13' is apart from the terminal portion 20. However, the FPCB 13' may be located on the terminal portion 20 as described below with reference to FIG. 14.

FIGS. 11 and 12 describe that the organic material layer 60 includes two layers. However, the disclosure is not limited thereto. According to some embodiments, the organic material layer 60 may include three or more layers as described with reference to FIGS. 7 and 8.

Figure 14:
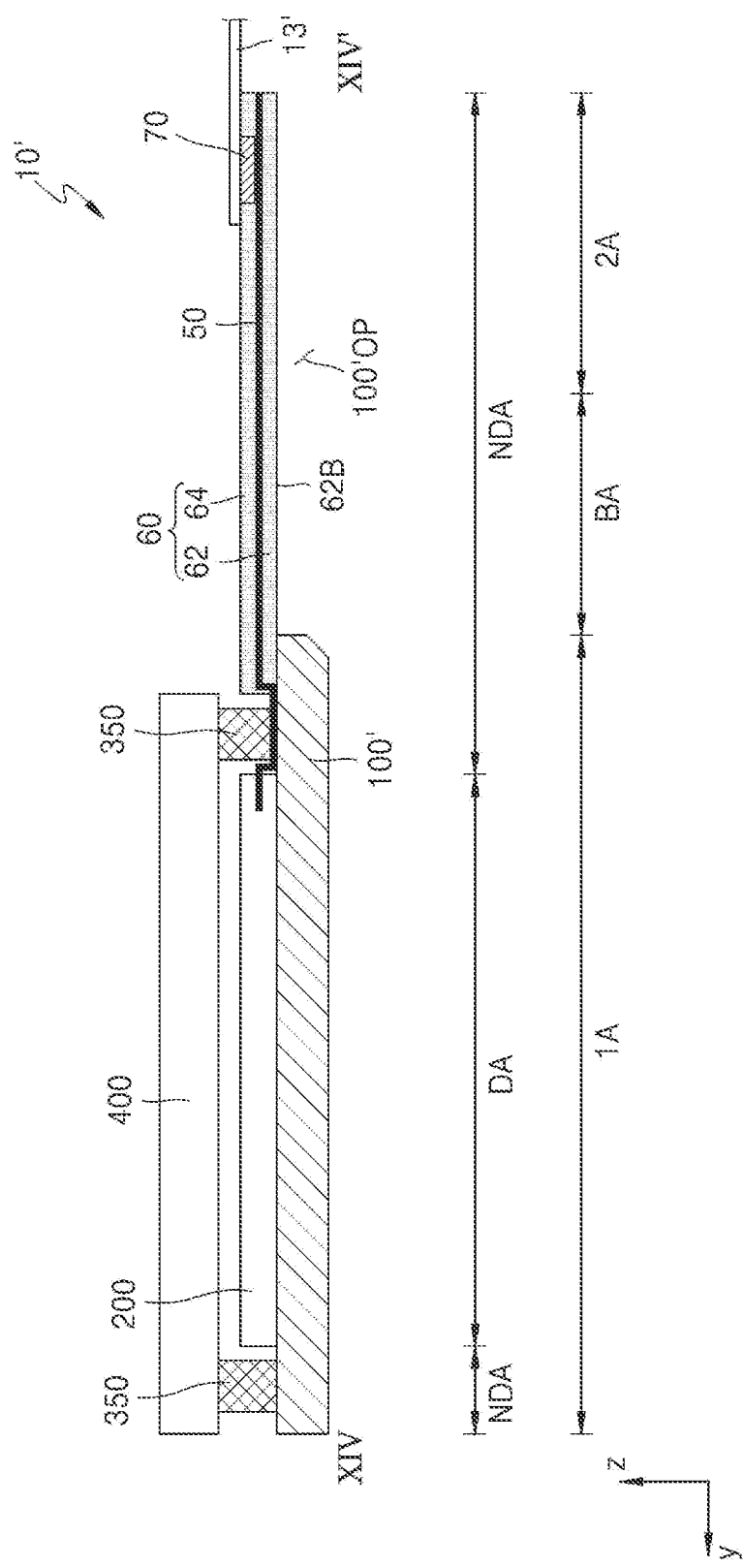
FIG. 14 is a cross-sectional view schematically illustrating a display device according to another embodiment.
Figure 15:
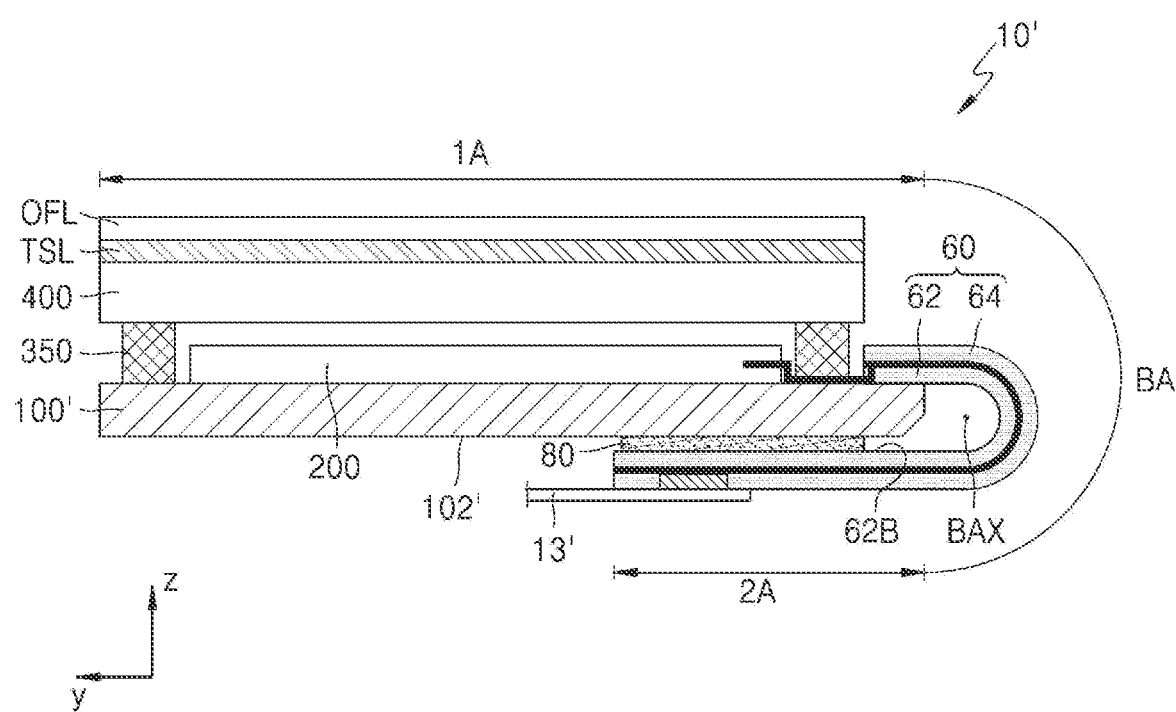
FIG. 15 is a cross-sectional view illustrating a display device according to an embodiment.

FIG. 14 is a cross-sectional view schematically illustrating the display device 10' according to some embodiments. FIG. 14 is the cross-sectional view taken along the line XIV-XIV' of FIG. 13. FIG. 15 is a cross-sectional view illustrating the display device 10' according to some embodiments. FIG. 14 illustrates the cross-section before the display device is bent, for convenience of explanation.

Referring to FIG. 14, the substrate 100' may have the opening 100'OP corresponding to the bending area BA and the second area 2A. The opening 100'OP of the substrate 100' may be formed by the process described above with reference to FIG. 4A. Also, the opening 100'OP of the substrate 100' illustrated in FIG. 14 may be formed by adjusting an area of the opening portion BL-OP of the blocking layer BL (FIG. 4A). The opening 100'OP may be formed to cross an upper surface and a lower surface of the substrate 100' and the substrate 100' may actually be understood to include only the portion located in the first area 1A.

The display layer 200 may be located on the substrate 100', the display layer 200 may be covered by the encapsulation substrate 400, and the sealing member 350 may be located between the substrate 100' and the encapsulation substrate 400 as described above.

The wiring layer 50 may extend from an end of the first area 1A to the second area 2A through the bending area BA. The wiring layer 50 may be located on a layer including an organic material, for example, the organic material layer 60. The organic material layer 60 may include the first organic material layer 62 and the second organic material layer 64. The wiring layer 50 may be located above the first organic material layer 62 and below the second organic material layer 64. For example, the wiring layer 50 may contact a first surface of the first organic material layer 62.

The first organic material layer 62 and the second organic material layer 64 may be located only in the non-display area NDA. The first organic material layer 62 and the second organic material layer 64 may have an area corresponding to the bending area BA and the second area 2A. A width of each of the first organic material layer 62 and the second organic material layer 64 in a y direction may be greater than a width of the opening 100'OP in the y direction. The first organic material layer 62 and the second organic material layer 64 may be located in a portion of the first area 1A, which is adjacent to the bending area BA, the bending area BA, and the second area 2A. The opening 100'OP of the substrate 100' may be covered by the organic material layer 60, for example, the first organic material layer 62. A portion of the second surface 62B of the first organic material layer 62 may be exposed through the opening 100'OP. The exposed portion of the second surface 62B of the first organic material layer 62 may correspond to the bending area BA and the second area 2A.

The first organic material layer 62 and the second organic material layer 64 may include an organic insulating material. The second organic material layer 64 may have an opening portion located in the second area 2A, and a portion of the wiring layer 50, for example, the terminal portion 20 described above with reference to FIG. 13 may be exposed through the opening portion. The terminal portion 20 described above with reference to FIGS. 1 and 2 may be located on the substrate 100, for example, the second portion 100b. However, the terminal portion 20 of the display device 10' of FIGS. 13 and 14 might not be located on the substrate 100'. The terminal portion 20 may be electrically connected to the FPCB 13' through a conductive material layer 70.

Referring to FIG. 15, the organic material layer 60, for example, the first organic material layer 62 and the second organic material layer 64 may be bent with respect to the bending axis BAX. The wiring layer 50 may also be bent when the first organic material layer 62 and the second organic material layer 64 are bent. Because the substrate 100' includes the opening 100'OP, a portion of the non-display area NDA (FIG. 14) of the display device 10' may be bent regardless of a type of a material included in the substrate 100', as described above.

In the display device 10' that is bent, the second area 2A may overlap the first area 1A. For example, the organic material layer 60 and the wiring layer 50 corresponding to the bending area BA may be bent to have a curvature, while the organic material layer 60 and the wiring layer 50 corresponding to the second area 2A might not be bent and may be located in parallel with the substrate 100'. For example, the components of the display device 10', for example, portions of the organic material layer 60 and the wiring layer 50, the portions corresponding to the second area 2A, the conductive material layer 70, and the FPCB 13' may overlap the components of the display device 10 included in the first area 1A, for example, the substrate 100' and the display layer 200.

The adhesive layer 80 may be located between the second surface 62B of the first organic material layer 62 and a second surface 102' of the substrate 100'. The adhesive layer 80 may directly contact the second surface 62B of the first organic material layer 62 and the second surface 102' of the substrate 100'. The touch sensing member TSL and the optical functional member OFL may be located on an encapsulation member, for example, the encapsulation substrate 400.

Figure 16:
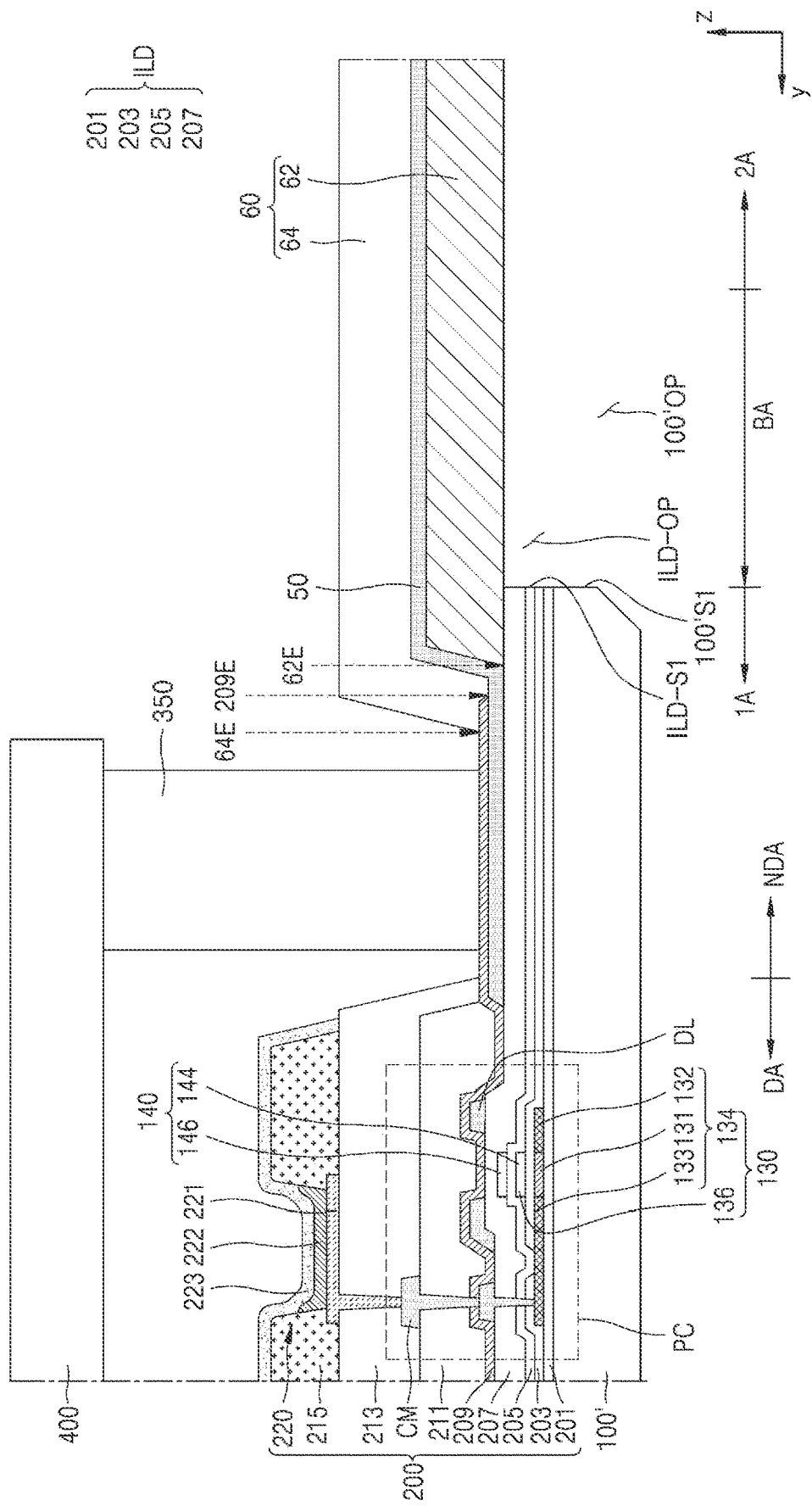
FIG. 16 is a cross-sectional view schematically illustrating a display device according to another embodiment.
Figure 17:
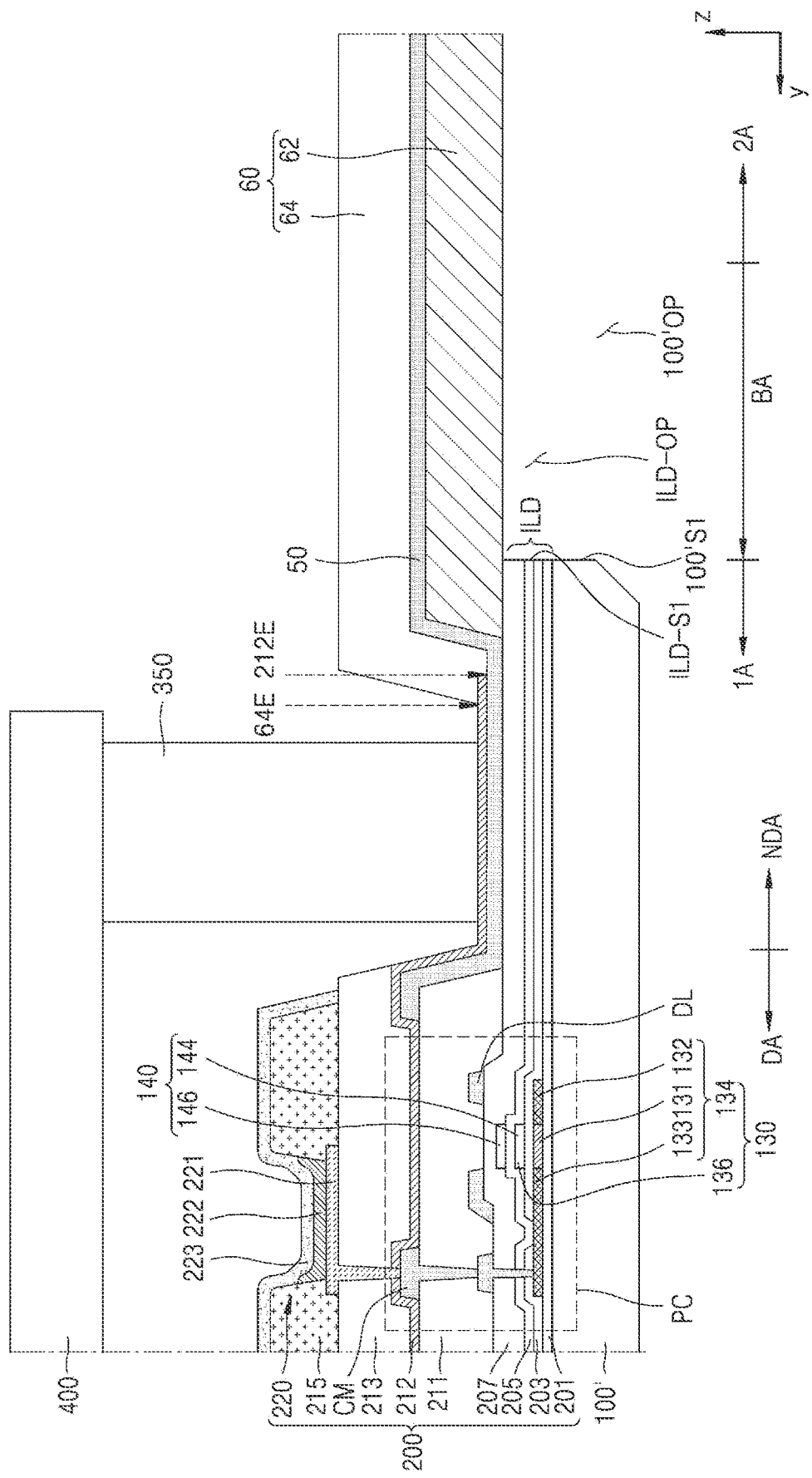
FIG. 17 is a cross-sectional view schematically illustrating a display device according to another embodiment.

Each of FIGS. 16 and 17 is a cross-sectional view schematically illustrating a display device according to some embodiments. FIGS. 16 and 17 describe the cross-section of the display device before the display device is bent, for convenience.

According to some embodiments, referring to FIG. 16, the substrate 100' may be located only in the first area 1A. The display layer 200 may be located on the substrate 100' and the structure of the display layer 200 and the structure of the sealing member 350 and the encapsulation substrate 400 are described above with reference to FIG. 5.

The wiring layer 50 may include wires to apply signals and/or power to the display layer 200 as described above. The wiring layer 50 may be located on the same layer (the second interlayer insulating layer 207) as the data line DL and may include the same material as the data line DL.

The wiring layer 50 may extend toward the second area 2A in the non-display area NDA. A portion of the wiring layer 50 may be covered by the third interlayer insulating layer 209 in the first area 1A or on the substrate 100' and the wiring layer 50 might not directly contact the sealing member 350. The wiring layer 50 may extend onto the first organic material layer 62 forming a step difference with the second interlayer insulating layer 207.

The first organic material layer 62 may continually extend in a ty direction while partially overlapping the substrate 100'. The first distal end 62E of the first organic material layer 62, which is adjacent to the display area DA, may overlap an end of the first portion 100A of the substrate 100' and may be apart from an outer surface of the sealing member 350 by a certain distance.

The wiring layer 50 may be covered by the second organic material layer 64. The second organic material layer 64 may cover an end of the third interlayer insulating layer 209, which is adjacent to the bending area BA. With respect to this aspect, FIG. 16 illustrates that the first distal end 64E of the second organic material layer 64 is located more adjacent to the sealing member 350 than the distal end 209E of the third interlayer insulating layer 209, which is adjacent to the bending area BA. The first distal end 64E of the second organic material layer 64 may be apart from the sealing member 350 by a certain distance.

The second organic material layer 64 may be formed together during a process of forming the display layer 200. For example, the second organic material layer 64 may be formed together during a process of forming the first organic insulating layer 211 or the second organic insulating layer 213 and may include the same material as the first organic insulating layer 211 or the second organic insulating layer 213.

The first organic material layer 62 and the second organic material layer 64 may support or protect the wiring layer 50 and may alleviate the stress generated due to bending of the display device. The first organic material layer 62 and the second organic material layer 64 may include an organic insulating material.

The substrate 100' may have the opening 100'OP as described above and the inorganic insulating layer ILD on the substrate 100' may have the opening ILD-OP overlapping the opening 100'OP. The opening ILD-OP of the inorganic insulating layer ILD may be formed together during a process of forming the opening 100'OP of the substrate 100'. According to some embodiments, when the inorganic insulating layer ILD is formed on the substrate 100' including Si, the inorganic insulating layer ILD may also include Si like the substrate 100', and thus, the inorganic insulating layer ILD may also be removed during the process (for example, an etching process) of forming the opening 100'OP. The opening ILD-OP of the inorganic insulating layer ILD may overlap the opening 100'OP of the substrate 100' and may have substantially the same width or area as the opening 100'OP.

The inorganic insulating layer ILD may include one or more of the buffer layer 201, the gate insulating layer 203, the first interlayer insulating layer 205, and the second interlayer insulating layer 207. According to some embodiments, FIG. 16 illustrates that the inorganic insulating layer ILD includes the buffer layer 201, the gate insulating layer 203, the first interlayer insulating layer 205, and the second interlayer insulating layer 207.

According to some embodiments, referring to FIG. 17, the inorganic insulating layer ILD and the substrate 100' may respectively have the openings ILD-OP and 100'OP overlapping each other and the corresponding structure is described above with reference to FIG. 16.

The wiring layer 50 of FIG. 17 may be formed together during the same process as the contact metal layer CM and may include the same material as the contact metal layer CM. A portion of the wiring layer 50 may be covered by the fourth interlayer insulating layer 212. Thus, the wiring layer 50 might not directly contact the sealing member 350. The wiring layer 50 may be located on the first organic material layer 62 and the second organic material layer 64 may be located on the wiring layer 50. The characteristics of the wiring layer 50 and the components peripheral to the wiring layer 50 are described with reference to FIG. 6.

FIGS. 16 and 17 illustrate that the organic material layer 60 includes two layers. However, the disclosure is not limited thereto. According to some embodiments, the organic material layer 60 may include three or more layers as described with reference to FIGS. 7 and 8.

FIGS. 16 and 17 illustrate a side surface 100'S1 of the substrate 100', which is adjacent to the bending area BA, includes an oblique surface and the first side surface ILD-S1 of the organic insulating layer ILD does not include an oblique surface. However, the disclosure is not limited thereto. Each of the first side surface 100'S1 of the substrate 100' and the first side surface ILD-S1 of the inorganic insulating layer ILD may have the shape described above with reference to FIGS. 9A through 9E or the shape derived from the shape described above with reference to FIGS. 9A through 9E.

FIGS. 16 and 17 illustrate that the encapsulation member includes the encapsulation substrate 400. However, according to some embodiments, the thin film encapsulation layer 400' rather than the encapsulation substrate 400 may be included as illustrated in FIG. 18.

Figure 18:
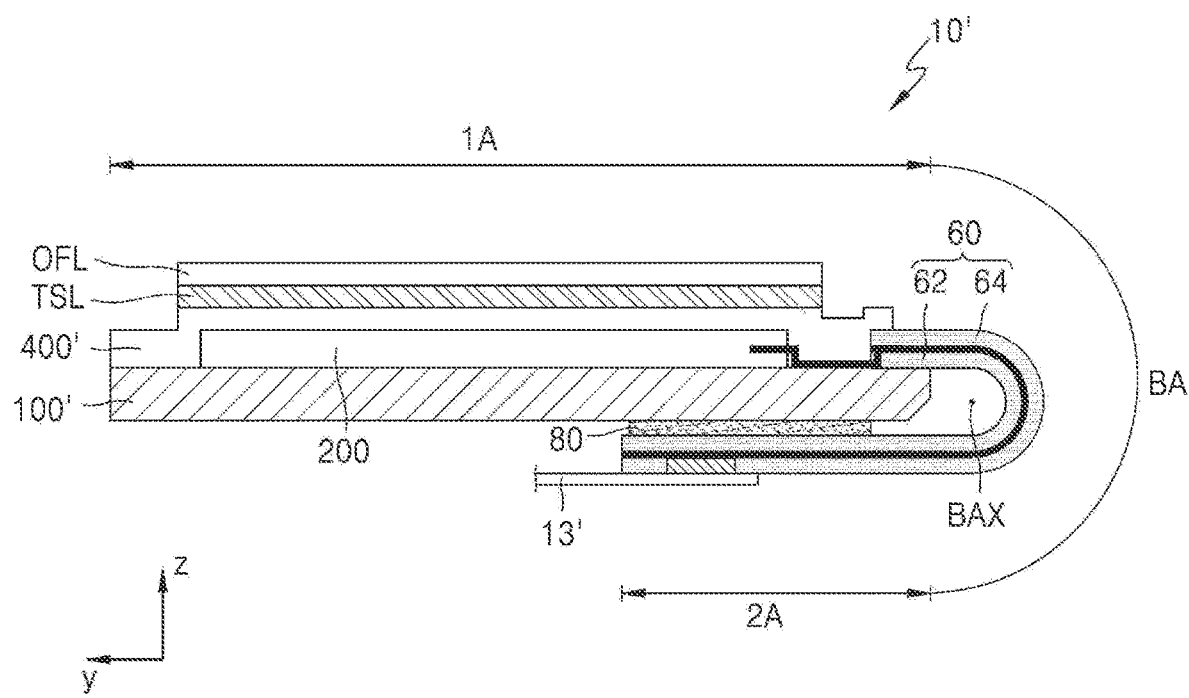
FIG. 18 is a cross-sectional view schematically illustrating a display device according to another embodiment.

FIG. 18 is a cross-sectional view schematically illustrating the display device 10' according to some embodiments.

The embodiments described with respect to FIG. 18 includes substantially the same components as the embodiments described above with reference to FIGS. 15 through 17. However, the embodiments described with respect to FIG. 18 may be different from the embodiments described with respect to FIGS. 15 through 17 in that the embodiments described with respect to FIG. 18 may include the thin film encapsulation layer 400' as an encapsulation member. The thin film encapsulation layer 400' may include at least one organic encapsulation layer and at least one inorganic encapsulation layer. The thin film encapsulation layer 400' may overlap the organic material layer 60.

Figure 19:
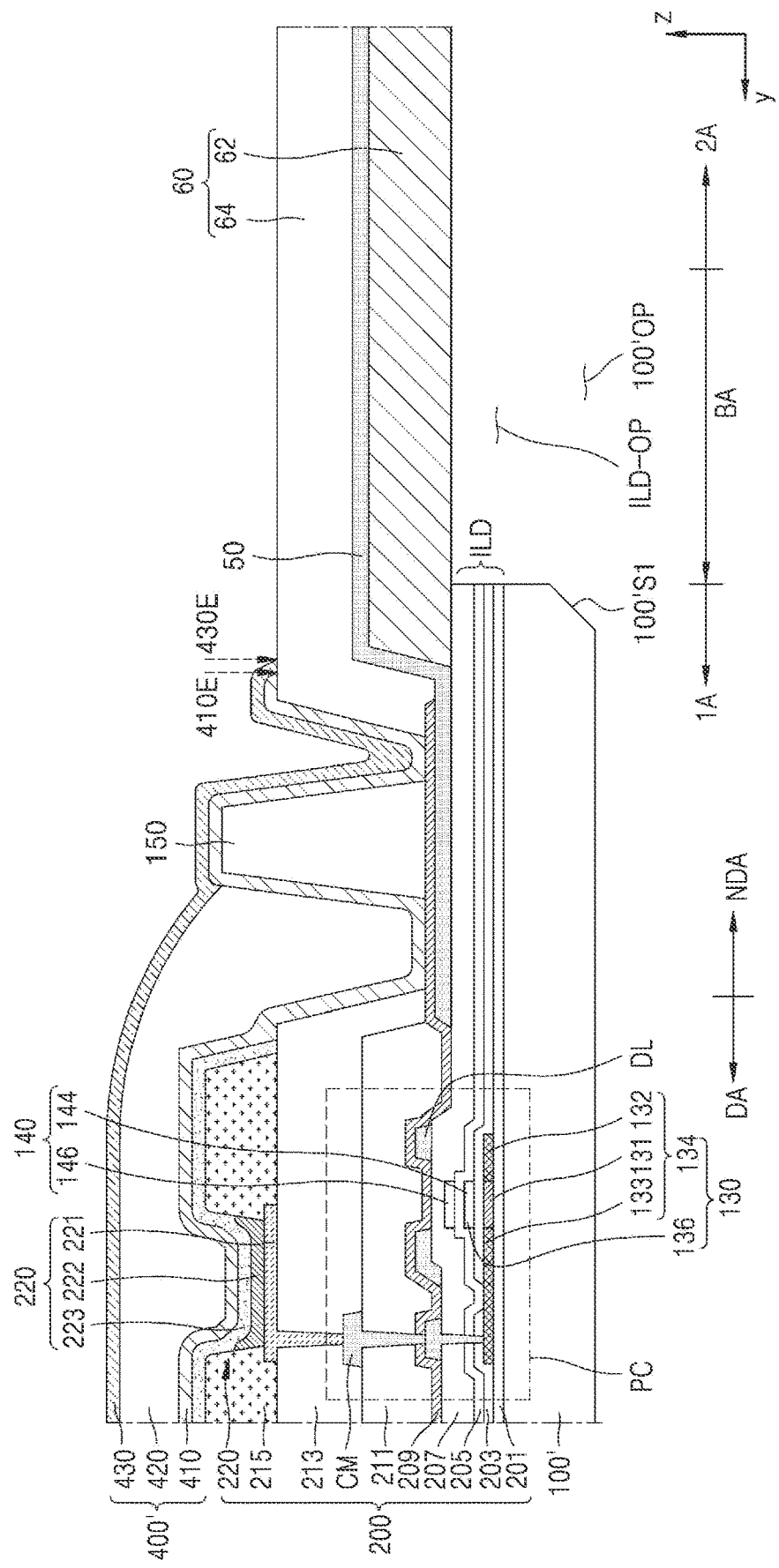
FIG. 19 is a cross-sectional view schematically illustrating a display device according to another embodiment.
Figure 20:
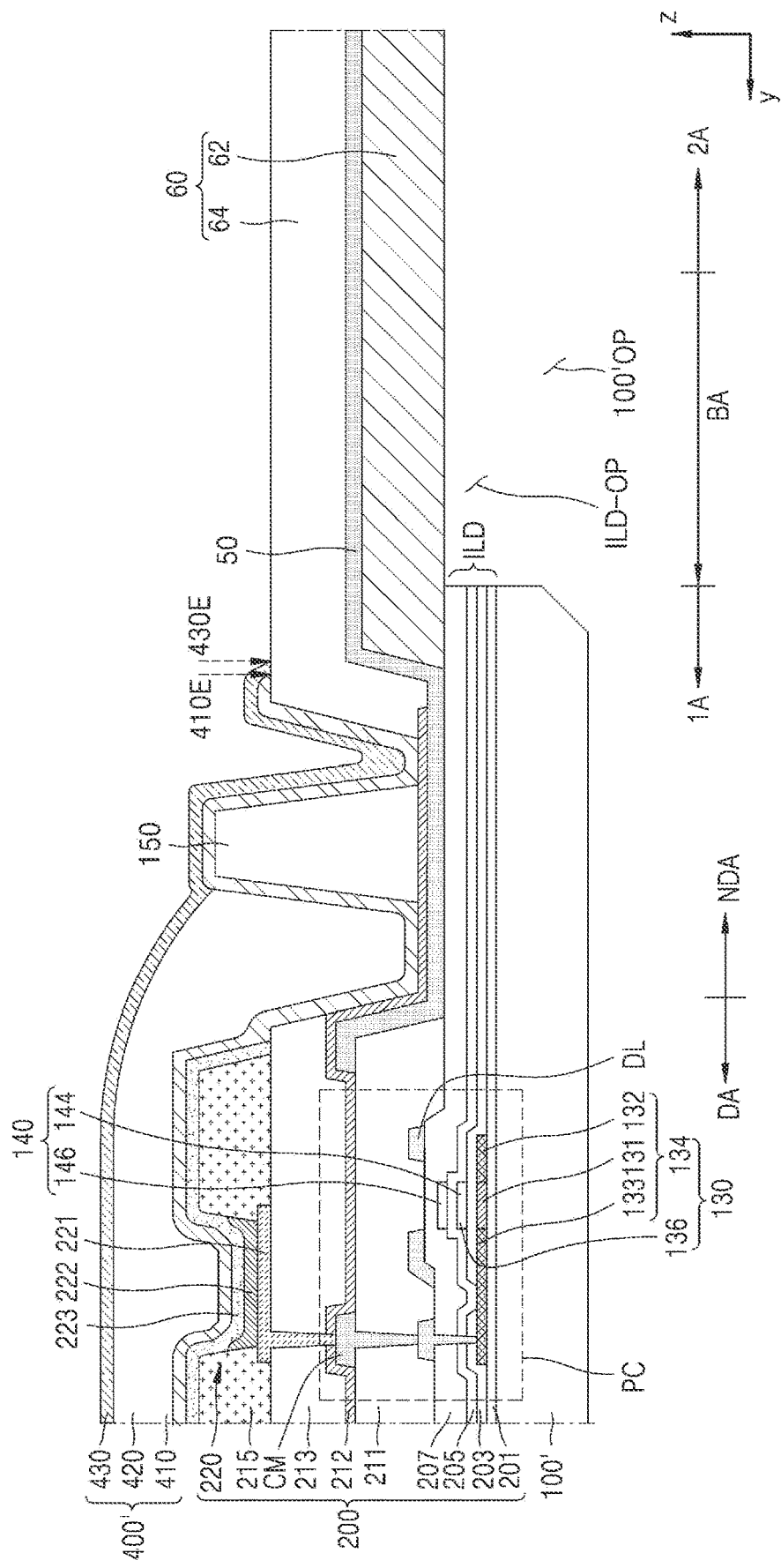
FIG. 20 is a cross-sectional view schematically illustrating a display device according to some embodiments.

Each of FIGS. 19 and 20 is a cross-sectional view schematically illustrating a display device according to some embodiments. FIGS. 19 and 20 describe the cross-section of the display device before the display device is bent, for convenience.

Referring to FIGS. 19 and 20, the opening 100'OP may correspond to the bending area BA and the second area 2A, and thus, the substrate 100' may be located only in the first area 1A. The display layer 200 may be located on the substrate 100' and the location and the characteristics of the wiring layer 50, the characteristics of the organic material layer 60, and the structure of the peripheral components are described with reference to FIGS. 16 and 17, and thus, hereinafter, descriptions will be given based on differences.

The thin film encapsulation layer 400' may include the first inorganic encapsulation layer 410, the organic encapsulation layer 420, and the second inorganic encapsulation layer 430, wherein the first inorganic encapsulation layer 410 and the second inorganic encapsulation layer 430 may extend onto the organic material layer 60, for example, the second organic material layer 64. For example, the distal end 410E of the first inorganic encapsulation layer 410 and/or the distal end 430E of the second inorganic encapsulation layer 430 may be located on the second organic material layer 64.

While the present disclosure has been described with reference to embodiments shown in the drawings, it will be understood by those skilled in the art that the embodiments are just example and various changes in form and details may be made therein. Therefore, the scope of the present disclosure will be defined by the technical ideas of the appended claims and their equivalents.

The invention claimed is:

1. A display device comprising:
a bending area between a first area and a second area;
a substrate having a first opening, at least a portion of the first opening corresponding to the bending area;
a display layer on a first surface of the substrate in the first area;
an encapsulation member on the display layer;
a first organic material layer on the substrate to cover the first opening of the substrate such that a bottom surface of the first organic material layer is exposed through the first opening; and
a wiring layer on the first organic material layer and comprising a plurality of wires extending in a direction crossing the bending area.

2. The display device of claim 1, further comprising
at least one inorganic insulating layer on the substrate, wherein
the at least one inorganic insulating layer has a second opening overlapping the first opening.

3. The display device of claim 2, wherein
the first organic material layer is exposed through the first opening and the second opening.

4. The display device of claim 1, further comprising
a second organic material layer on the wiring layer and overlapping the first organic material layer.

5. The display device of claim 4, wherein
at least one of the first organic material layer or the second organic material layer includes
a same material as an organic insulating layer of the display layer.

6. The display device of claim 4, wherein
a portion of the wiring layer in the first area
is covered by a first insulating layer included in the display layer.

7. The display device of claim 6, wherein
an edge of the first insulating layer is covered by the second organic material layer.

8. The display device of claim 6, wherein
the first insulating layer includes an inorganic insulating material.

9. The display device of claim 4, wherein
the encapsulation member comprises an encapsulation substrate in the first area and facing the substrate, the display device further comprising
a sealing member between the substrate and the encapsulation substrate.

10. The display device of claim 9, wherein
the first organic material layer and the second organic material layer are spaced apart from the sealing member.

11. The display device of claim 4, wherein
the encapsulation member comprises at least one organic encapsulation layer and at least one inorganic encapsulation layer.

12. The display device of claim 11, wherein
an edge of the at least one inorganic encapsulation layer is on the second organic material layer.

13. The display device of claim 1, wherein
the first organic material layer includes a first surface facing the wiring layer and a second surface that is opposite to the first surface, and the first organic material layer is bent with respect to a bending axis, and a portion of the second surface of the first organic material layer faces a second surface of the substrate, the second surface of the substrate corresponding to the first area.

14. The display device of claim 1, wherein
the first opening is located only in the bending area, and
the substrate includes a first portion and a second portion spaced apart from each other based on the first opening.

15. The display device of claim 1, wherein
the first opening is in the bending area and the second area, and
the substrate corresponds to only the first area.

16. A display device comprising:
a bending area between a first area and a second area,
a substrate having a first opening, at least a portion of the first opening corresponding to the bending area;
a display layer on a first surface of the substrate in the first area;
an encapsulation member on the display layer;
a lower organic material layer on the substrate to cover the first opening of the substrate such that a bottom surface of the lower organic material layer is exposed through the first opening; and
a wiring layer on the lower organic material layer and including a plurality of wires extending in a direction crossing the bending area,
wherein the lower organic material layer has an area corresponding to the bending area and the second area, the lower organic material layer is bent with respect to a bending axis, and a portion of the lower organic material layer overlaps the substrate corresponding to the first area.

17. The display device of claim 16, wherein
the lower organic material layer includes a same material as an organic insulating layer in the display layer.

18. The display device of claim 16, further comprising
at least one upper organic material layer on the wiring layer and overlapping the lower organic material layer.

19. The display device of claim 18, wherein
a portion of the wiring layer in the first area is covered by a first insulating layer in the display layer, and
an edge of the first insulating layer is covered by the at least one upper organic material layer.

20. The display device of claim 19, wherein
the first insulating layer includes an inorganic insulating layer.

21. The display device of claim 18, wherein
the encapsulation member comprises an encapsulation substrate in the first area and facing the substrate, the display device further comprising
a sealing member between the substrate and the encapsulation substrate, wherein
the lower organic material layer and the at least one upper organic material layer are spaced apart from the sealing member.

22. The display device of claim 18, wherein
the encapsulation member comprises at least one organic encapsulation layer and at least one inorganic encapsulation layer, and
an edge of the at least one inorganic encapsulation layer is located on the at least one upper organic material layer.

23. The display device of claim 16, further comprising
at least one inorganic insulating layer on the substrate, wherein the at least one inorganic insulating layer has a second opening overlapping the first opening.

24. The display device of claim 23, wherein
the first opening and the second opening are located only in the bending area, and
the substrate includes a first portion and a second portion spaced apart from each other based on the first opening.

25. The display device of claim 23, wherein
the first opening and the second opening are located in the bending area and the second area, and
the substrate corresponds to only the first area.

* * * * *